United States Patent [19]

Tsuboi

[11] Patent Number: 6,081,394
[45] Date of Patent: Jun. 27, 2000

[54] RECORDED MAGNETIZATION STATE MEASURING METHOD AND DEVICE

[75] Inventor: Shinzo Tsuboi, Tokyo, Japan

[73] Assignee: NEC Corporation, Tokyo, Japan

[21] Appl. No.: 09/004,023

[22] Filed: Jan. 7, 1998

[30] Foreign Application Priority Data

Jan. 16, 1997 [JP] Japan ................................. 9-005357

[51] Int. Cl.$^7$ .............................. G11B 5/02; G01R 33/12
[52] U.S. Cl. ............................................ 360/25; 324/212
[58] Field of Search ............................... 360/25, 39, 134, 360/135; 428/65.3; 324/210, 212

[56] References Cited

U.S. PATENT DOCUMENTS

| | | | |
|---|---|---|---|
| 5,851,643 | 12/1998 | Honda et al. | 428/212 |
| 5,879,783 | 3/1999 | Chang et al. | 428/141 |

FOREIGN PATENT DOCUMENTS

| | | |
|---|---|---|
| 62-190478 | 8/1987 | Japan . |
| 62-288585 | 12/1987 | Japan . |
| 64-477 | 1/1989 | Japan . |
| 64-91076 | 3/1989 | Japan . |
| 3-251776 | 11/1991 | Japan . |
| 4-229408 | 8/1992 | Japan . |
| 7201001 | 8/1995 | Japan . |
| 8-87701 | 4/1996 | Japan . |

OTHER PUBLICATIONS

Y. Tang et al., "A Technique for Measuring Nonlinear Bit Shift", IEEE Transactions on Magnetism, vol. 27, No. 6, Nov. 1991, pp. 5316–5318.

T. Lam et al., "Effect of Pole Trimming on Write Properties of Merged MR Heads", IEEE International Magnetics Conference Digest of the Technical Papers, 1995, pp. GP–29.

Primary Examiner—W. Chris Kim
Attorney, Agent, or Firm—Sughrue, Mion, Zinn, Macpeak & Seas, PLLC

[57] ABSTRACT

In the recorded magnetization state measurement method of this invention, a recorded magnetization pattern formed on a medium is first detected by a magnetic force microscope (MFM). An MFM output signal extractor then extracts a one-dimensional MFM output signal along the direction of recording at a prescribed MFM reproduction width from the recorded magnetization pattern detected by the magnetic force microscope. A waveform value analyzer then calculates as output reproduction the average value of amplitude of the MFM output signal extracted by the MFM output signal extractor and calculates as medium noise the standard deviation of amplitude of the MFM output signal.

22 Claims, 20 Drawing Sheets

150kFRPI

RECORDED MAGNETIZATION STATE MEASURING METHOD AND DEVICE

BACKGROUND OF THE INVENTION

1. Field of the Invention

The present invention relates to a recorded magnetization state measuring method and recorded magnetization state measuring device for analyzing the magnetization state of a magnetic recording medium (hereinbelow referred to as simply "medium") such as a magnetic tape or magnetic disk.

2. Description of the Related Art

In the prior art, the recorded magnetization state of a medium on which recording was effected by a recording head was evaluated by means of the reproduced signal by way of the reproducing head as shown in FIG. 1. In Step 111, a recorded magnetization pattern was first formed on the medium by a recording head. In Step 112, this recorded magnetization pattern was then reproduced by the reproducing head, and the output reproduction was measured. In Step 113, the S/N ratio (Signal-to-Noise ratio) of the medium was found based on this output reproduction.

In recent years, output has been improved due to the use of a magneto-resistance type reproducing head instead of the magnetic induced type head of the prior art. However, in areas within the medium having high recording density, the output is still low, and this prevents an accurate evaluation of the recorded magnetization state. In addition, this output is affected by the characteristics of the reproducing head, and the recorded magnetization state is therefore extremely difficult to accurately evaluate by means of the reproduced signals of the reproducing head.

Furthermore, high levels of recording density give rise to recording distortion in the magnetic recording medium. Recording distortion includes non-linear transition shift, partial erasure, and transition broadening. Non-linear transition shift is generally measured by 5-th harmonic method (as disclosed, for example, IEEE Transactions on Magnetism, Vol. 27, No. 6, 1991, pp. 5316–5318. (Y. Tang and C. Tsang))

In addition, it is clear that for a three-dimensional harmonic component V3 of a recording density D, and a fundamental harmonic wave component V1 of a recording density 3D, V1/(3·V3)=1 if partial erasure is not present, and V1/(3·V3)<1 if partial erasure is present. Partial erasure can therefore be measured quantitatively by using this relation. This fact was reported at the 1996 Intermag International Conference (address number GP29).

Nevertheless, the prior art has the following problems:

(1) Problems of measurement by the reproducing head

The first problem resulting from measurement by the reproducing head is that evaluation of the recorded magnetization state is prevented in areas having high recording density. The chief reason for this difficulty is that, if the reproduction gap-length and minimum recording wavelength are nearly equal, output drops due to gap loss, thereby preventing accurate measurement of the recorded magnetization state. The gap-length of a reproducing head of the current art is on the order of 0.1–0.2 $\mu$m, smaller gap-lengths being extremely difficult to achieve at the current state of the art. Even assuming the use of a reproducing head with smaller gap-length, output reproduction is also extremely difficult to estimate. A second reason for the above-described problem is that the output signal drops due to the effect of spacing during reproduction in high-density areas, thereby preventing the accurate measurement of the recorded magnetization state. If the effect of spacing can be eliminated, the recorded magnetization state can be accurately determined.

The second problem is that local recorded magnetization states of the medium cannot be accurately evaluated. The reproducing head cannot be reduced to a width of less than 1–2 $\mu$m because a reproduction track that is too narrow does not produce sufficient output reproduction. When measurements are carried out by the reproducing head, local recorded magnetization state in areas smaller than the reproducing head cannot be measured, with the result that a local recorded magnetization state in a range smaller than 1 $\mu$m within a track (for example, the recorded magnetization state at the edges of a track) cannot be accurately determined.

(2) Problems encountered in measurement of the amount of non-linear transition shift by the 5-th harmonic method The problem encountered in measuring the amount of non-linear transition shift by the 5-th harmonic method is that non-linear transition shift cannot be measured in isolation. In other words, methods of the prior art produce a measurement of the combination of non-linear transition shift and partial erasure rather than an accurate value for the amount of non-linear transition shift alone.

(3) Problems encountered in measurement of partial erasure

The main problem encountered in measuring partial erasure is that prior-art measurement methods assume that the reproduced waveform is vertically symmetrical. In actuality, by the reproducing head in most cases a waveform is vertically asymmetrical and therefore the reproducing head in most cases does not meet this assumed condition, thereby giving rise to error.

A second problem is that the details of partial erasure cannot be understood in measurement methods of the prior art. Measurement methods of the prior art determine partial erasure by measuring the average phenomena of the overall track width of the reproducing head by means of the signal reproduced by the reproducing head. However, since adequate output reproduction cannot be obtained if the reproduction track-width is too narrow, the reproducing head width cannot be made less than about 1–2 $\mu$m. As a result, the state of an area smaller than the reproducing head, i.e., a local state within a range smaller than 1 $\mu$m within a track (for example, the state of a track edge) cannot be accurately determined.

SUMMARY OF THE INVENTION

The object of the present invention is to provide a recorded magnetization state measurement method and device that allow observation of local recorded magnetization states, and that allow observation of the recorded magnetization state of a portion having high recording density without being influenced by the characteristics of the reproducing head.

In the method of measuring a recorded magnetization state according to the present invention, the recorded magnetization state recorded onto a medium by a recording head is first observed by means of a magnetic force microscope (MFM), following which an MFM output signal is obtained from the recorded magnetization pattern obtained by means of the magnetic force microscope. The output reproduction and medium noise can be calculated from the amplitude of this output signal. Measurement of local recorded magnetization states that is free from the influence of the width of the reproducing head is possible because the MFM output signal is not influenced by the reproducing head.

The recorded magnetization state measurement device of the present invention is provided with: a magnetic force microscope (MFM) that detects the recorded magnetization pattern formed on a medium; MFM output signal extraction means that extracts a one-dimensional MFM output signal along the recording direction at a prescribed MFM reproduction width from a recorded magnetization pattern detected by the magnetic force microscope; and waveform value analysis means that calculates as output reproduction the average value of amplitude of the MFM output signal extracted by means of the MFM output signal extraction means, and calculates as medium noise the standard deviation of amplitude of the MFM output signal.

The present invention enables accurate determination of recorded magnetization states of super-high recording density and in addition, allows both easy and accurate evaluation of a super-high-density recording head, medium, and read/write conditions. Further, the present invention enables measurement of the S/N ratio (signal-to-noise ratio) of the medium as well as measurement of localized S/N ratios of the track interior and recorded track edges.

Furthermore, based on the dependence of the MFM output upon lift scan height, the present invention enables determination of the dependence of output upon lift scan height during reproduction by a reproducing head as well as determination of the dependence of medium noise upon lift scan height. In addition, the invention enables calculation of the magnitude of output reproduction when recording is effected by a recording head having a track width less than or equal to 2 $\mu$m even in cases in which this recording cannot actually be reproduced by a reproducing head.

This invention further enables quantitative measurement of the amount of non-linear transition shift with respect to a recorded dibit pattern. The invention also enables quantitative measurement of partial erasure by means of a magnetic force microscope, as well as measurement of local partial erasure within and at the edges of a recorded track. The amount of non-linear transition shift and partial erasure can also be separated. The recording capability of a recording head can also be measured.

The above and other objects, features, and advantages of the present invention will become apparent from the following description with references to the accompanying drawings which illustrate an examples of the present invention.

DETAILED DESCRIPTION OF THE PREFERRED EMBODIMENTS (1) First Embodiment

Figure 1:
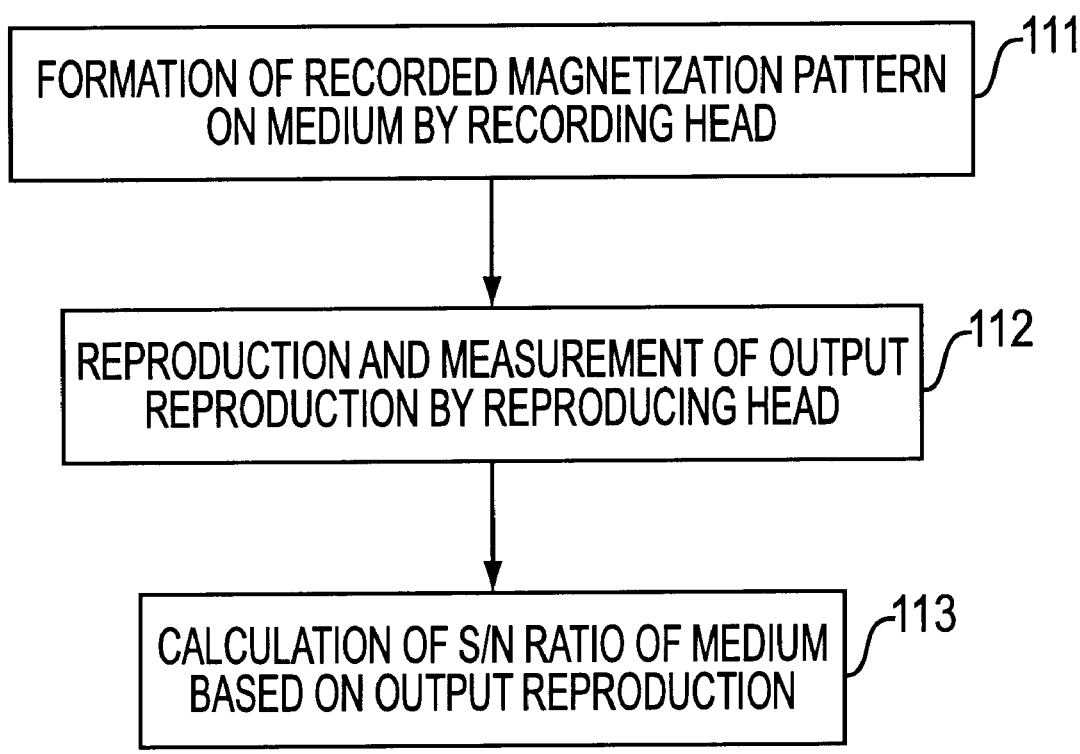
FIG. 1 is a flow chart showing a recorded magnetization state measurement method of the prior art.
Figure 2:
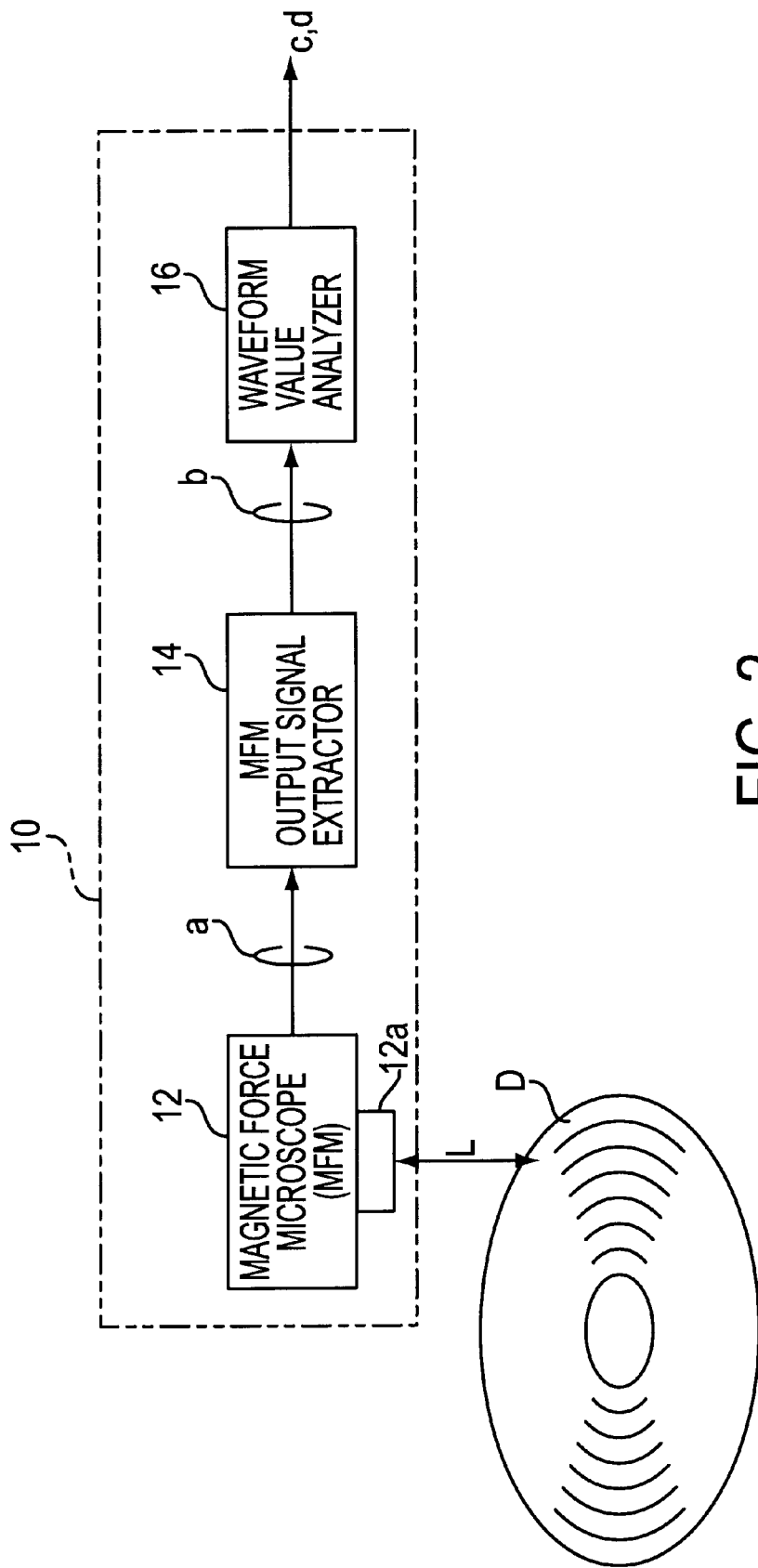
FIG. 2 is a block diagram showing the basic structure of a recorded magnetization state measurement device according to the present invention.

As shown in FIG. 2, recorded magnetization state measurement device 10 according to the first embodiment of the present invention is provided with magnetic force microscope (MFM) 12, MFM output signal extractor 14, and waveform value analyzer 16. Magnetic force microscope (MFM) 12 detects the recorded magnetization pattern a formed on medium D. Magnetic force microscope 12 is a magnetic head having a narrow track and narrow gap, which uses detection chip 12a as a magnetic sensor, and the spacing L between detection chip 12a and medium D can be controlled to any value. MFM output signal extractor 14 extracts a one-dimensional MFM output signal b along the direction of recording at a prescribed MFM reproduction width from recorded magnetization pattern a detected at magnetic force microscope 12. Waveform value analyzer 16 calculates as output reproduction c the average value of the amplitude of MFM output signal b extracted by means of MFM output signal extractor 14, and calculates as medium noise d the standard deviation of the amplitude of MFM output signal b. MFM output signal extractor 14 and waveform value analyzer 16 may be made up of, for example, a microcomputer or DSP (Digital Signal Processor).

Figure 3:
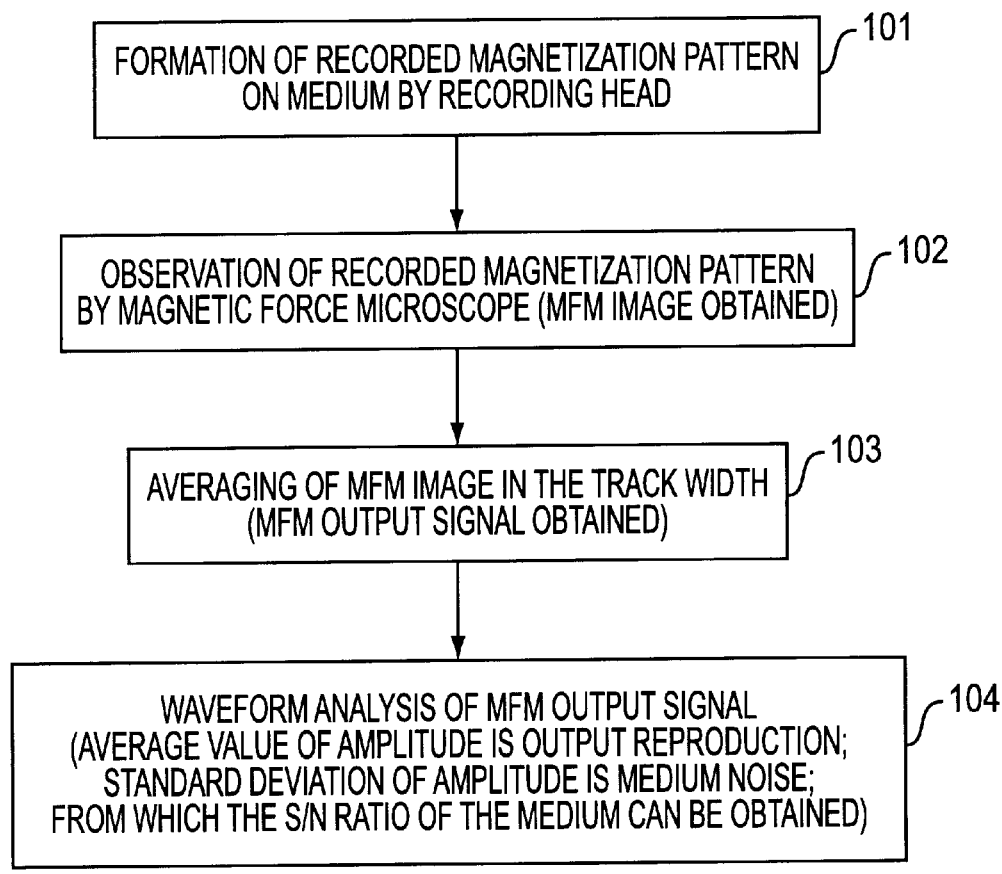
FIG. 3 is a flow chart showing the recorded magnetization state measurement method according to the present invention.

Explanation is next presented with reference to the flow chart of FIG. 3 regarding the recorded magnetization state measurement method that uses recorded magnetization state measurement device 10.

Figure 4:
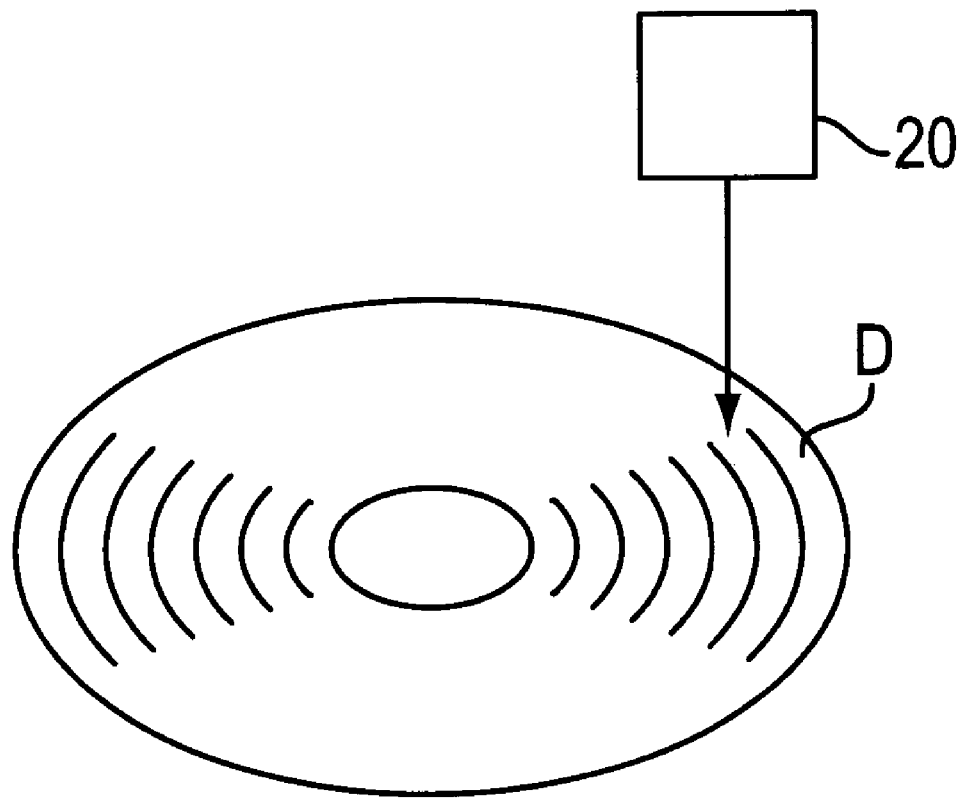
FIG. 4 is a schematic diagram showing the recorded state of a recorded magnetization pattern by a recording head.
Figure 5:
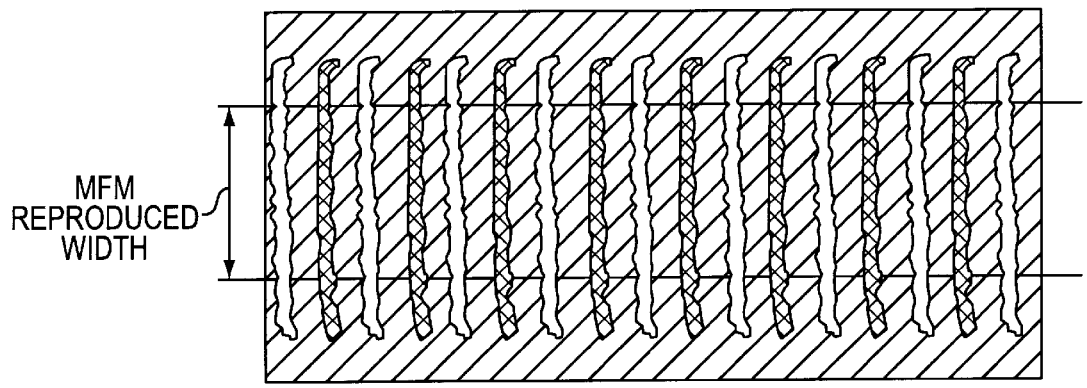
FIG. 5 is a plan view showing a recorded magnetization pattern (MFM image) detected by a magnetic force microscope of the recorded magnetization state measurement device of FIG. 2.
Figure 6:
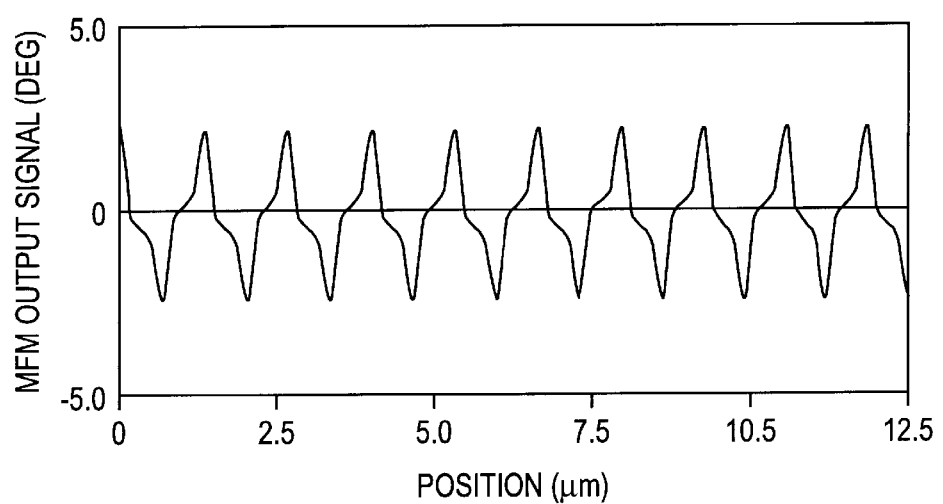
FIG. 6 is a waveform diagram showing an MFM output signal extracted by means of the MFM output signal extractor of the recorded magnetization state measurement device of FIG. 2.

In Step 101, recorded magnetization pattern a is first formed on medium D by means of recording head 20 shown in FIG. 4. In Step 102, this recorded magnetization pattern a is observed by means of magnetic force microscope 12 to obtain the MFM image shown in FIG. 5. In Step 103, MFM output signal extractor 14 produces the MFM output signal (MFM waveform signal) b shown in FIG. 6 by quantitatively averaging the MFM image in the direction of the track width. Finally, in Step 104, waveform value analyzer 16 analyzes the waveform values of MFM output signal b and calculates the average value of the amplitude and the standard deviation of the amplitude of MFM output signal b. The average value is the output reproduction (S: signal), and the standard deviation is the medium noise (N: noise), and the S/N ratio (Signal-to-Noise ratio) of the recording medium under evaluation can be measured based on these values.

Figure 7:
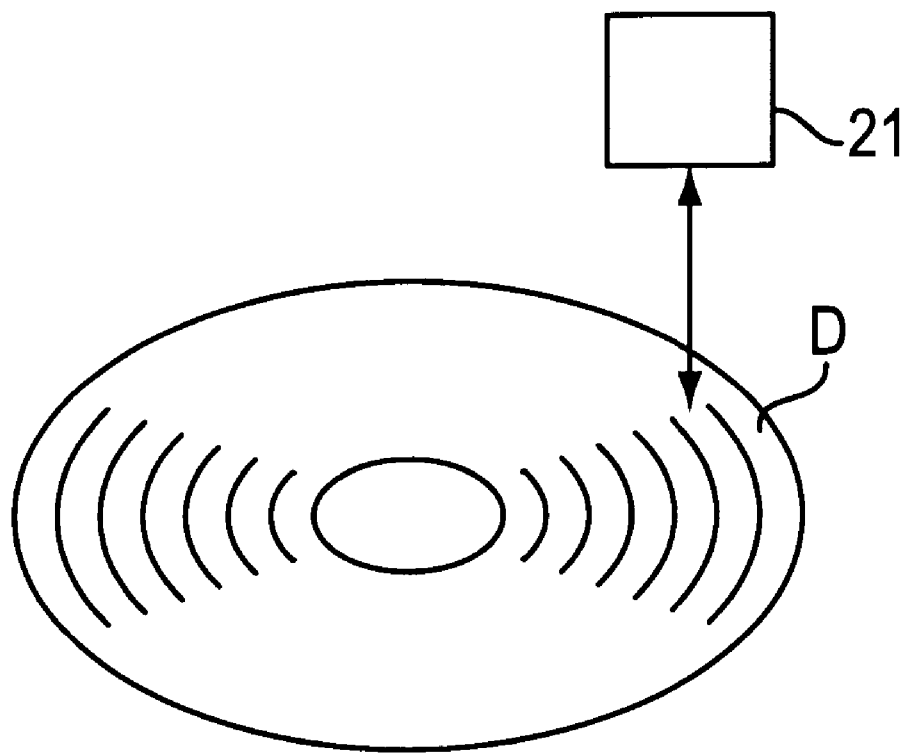
FIG. 7 is a schematic diagram showing the reproduced state of a recorded magnetization pattern by a reproducing head.

In this measurement method, the recorded magnetization state is measured based on MFM output signal b, which is found without using reproducing head 21 shown in FIG. 7. As a result, the local recorded magnetization state can be measured free of any influence by the width of the reproducing head. In addition, the method also enables highly precise and high-resolution measurement of a recorded magnetization state without influence from the characteristics of the reproducing head. For example, measurement is possible regarding the form of the recording head or the recording gap length that affect the recording and reproduction characteristics as well as the evaluation of the local signal or noise within a track. This recorded magnetization state measurement method and device of this invention are particularly effective in cases such as narrow-track and high-density recording.

The first embodiment of the present invention employs three types of medium D having Brδ of 80 Gμm, 100 Gμm, and 125 Gμm (where Br is the density of the residual magnetic flux, and δ is the thickness of the magnetic layer). The magnetic coercive force for all three types of medium D is 2200 Oe.

A recorded magnetization pattern a is formed on this medium D by means of recording head 20 that has a track width of 4 μm and a gap-length of 0.5 μm. During this formation, recording is carried out with various changes and at a packing density within the range of 5–400 kFRPI. This recorded magnetization pattern a is observed by means of magnetic force microscope 12 having an MFM reproduction width of 3 μm. The MFM image obtained by this observation is quantitative averaged at an MFM reproduction width of 3 μm by means of MFM output signal extractor 14 to obtain MFM output signal b. Waveform value analyzer 16 then calculates the average value of the amplitude of MFM output signal b as output reproduction c and the standard deviation of the amplitude as medium noise d, thereby measuring the S/N ratio of the recording medium.

Figure 8:
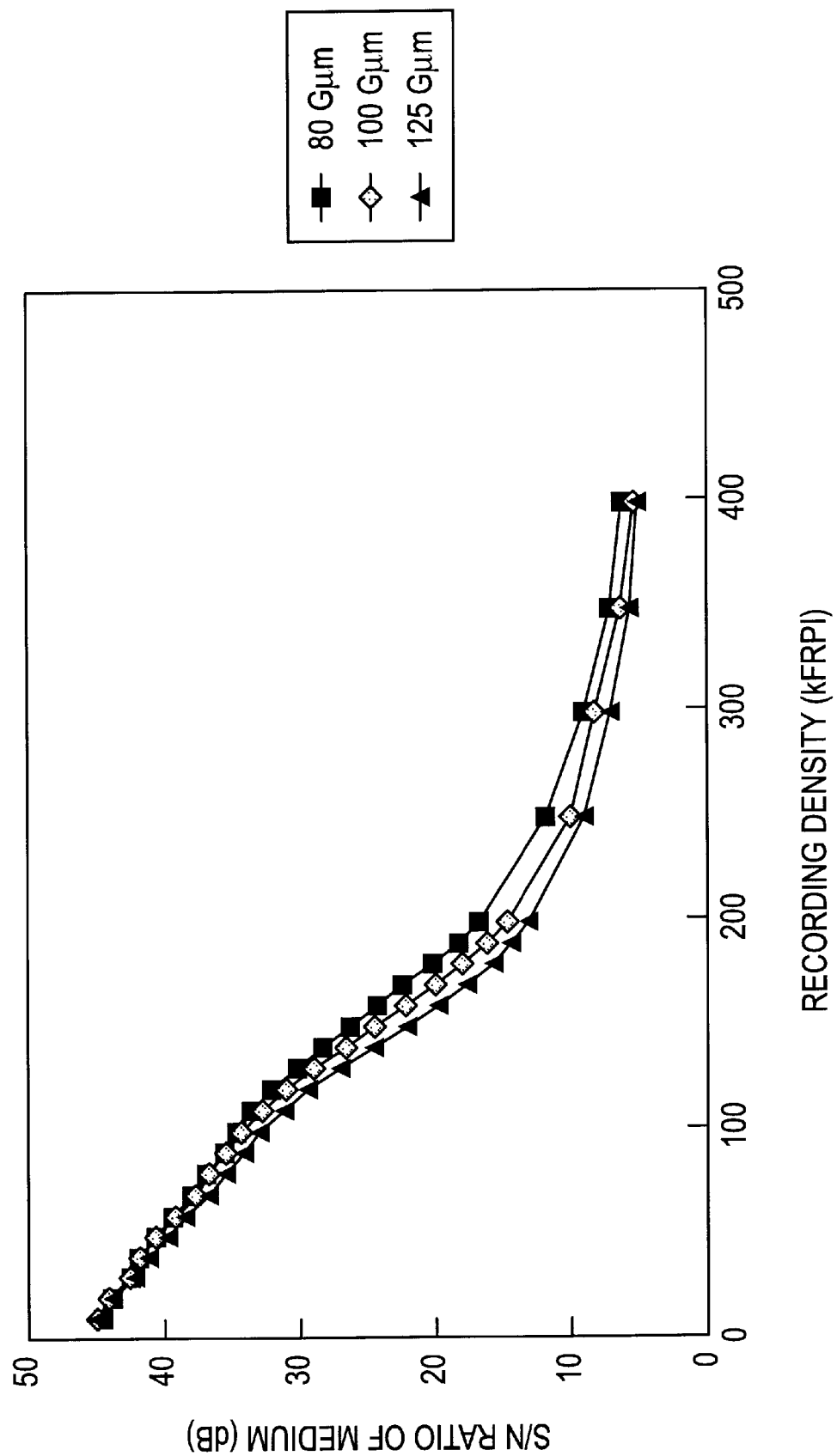
FIG. 8 is a graph showing the dependence upon recording density of the S/N ratio of three types of medium of differing Br$\delta$ as measured by the recorded magnetization state measurement device of the present invention.

Measurement results of this embodiment are shown in FIG. 8. This figure shows the S/N ratio with respect to various recording densities for three types of medium D having Brδ of 80 Gμm, 100 Gμm, and 125 Gμm. The present embodiment thus enables the measurement of recorded magnetization states that is free from influence by reproducing head 21. Moreover, the present embodiment enables accurate measurement of recorded magnetization states even at recording densities at which a reproduced signal cannot be detected by reproducing head 21 (i.e., at recorded magnetization states that cannot be measured by means of the reproducing head) through use of magnetic force microscope 12.

(2) Second Embodiment

Explanation is next presented regarding the second embodiment of the present invention. Explanation is here limited to only those points that differ from the above-described first embodiment.

In the present embodiment, recorded magnetization pattern a is formed by recording head 20 having a recording track width of 1 μm and a gap-length of 0.4 μm using a medium D having a magnetic coercive force of 2500 Oe and Brδ of 60 Gμm. The recording density of recorded magnetization pattern a formed in this embodiment is 10–450 kFRPI. The S/N ratio of medium D is measured from the recorded magnetization pattern a in the same way as in the first embodiment.

Figure 9:
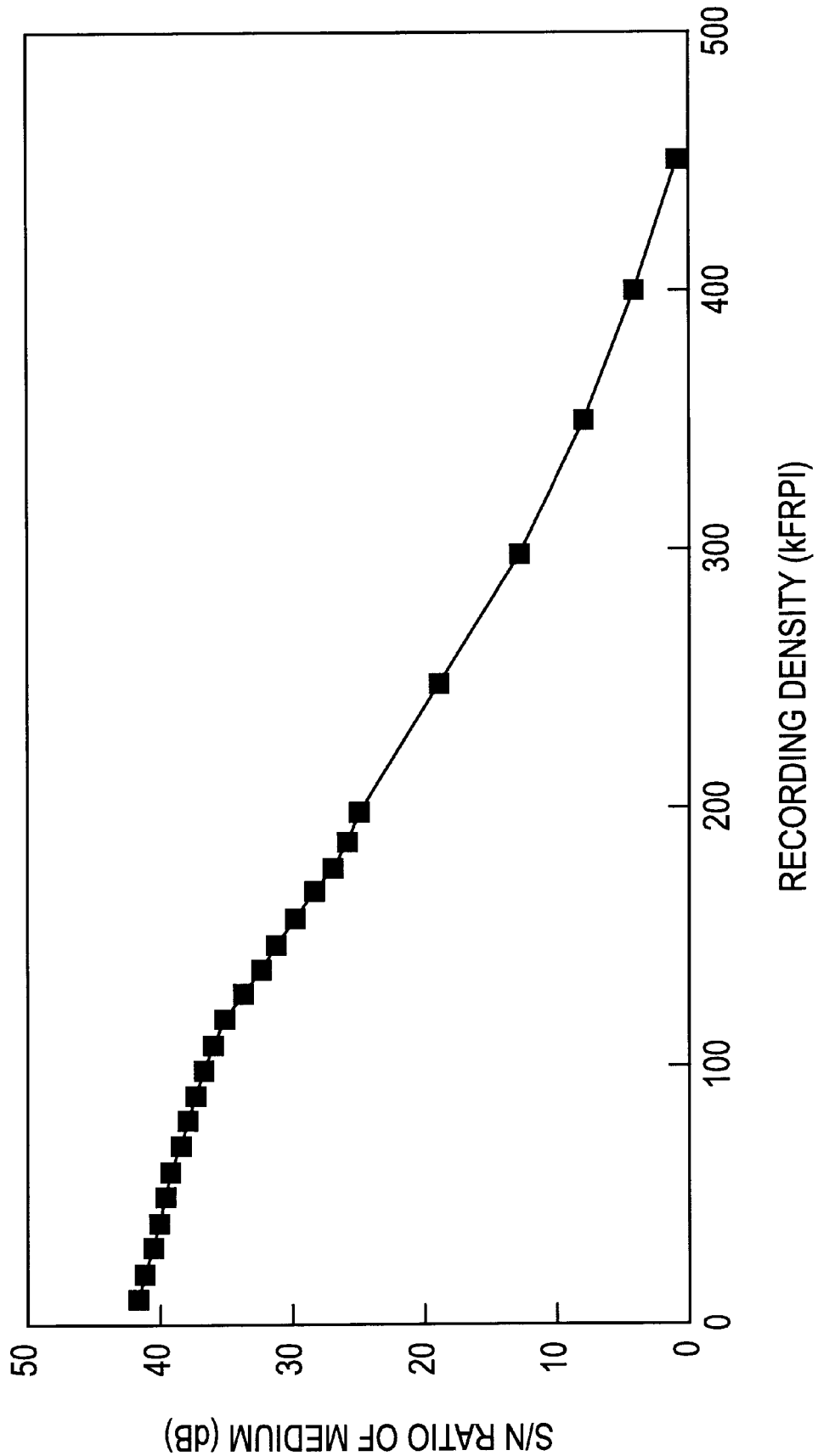
FIG. 9 is a graph showing the dependence upon recording density of the S/N ratio of a medium in which recording is effected by a narrow track head (track width: 1 $\mu$m) as measured by the recorded magnetization state measurement device of the present invention.

FIG. 9 shows the results of measurement of this embodiment. As can be clearly understood from this figure, the present embodiment enables measurement of the S/N ratio of a medium even at a high recording density of 450 kFRPI.

In an evaluation method of the prior art that uses reproducing head 21, a recorded magnetization pattern recorded by means of a narrow recording head 20 having a width of 1 μm or less cannot be evaluated because the reproduced signal during reproduction by reproducing head 21 is too small. However, the recorded magnetization state measurement device of the present invention enables accurate measurement of the recorded magnetization state even for recorded magnetization patterns having a narrow track width and high recording density for which a signal cannot be detected using reproducing head 21. In other words, the recorded magnetization state measurement device of the present invention is particularly effective for recording under narrow-track or high recording density conditions.

(3) Third Embodiment

Explanation is next presented regarding the third embodiment of the present invention. Here, explanation is limited only to points differing from the above-described first embodiment.

As in the first embodiment, this embodiment employs three types of medium D having magnetic coercive power of 2200 Oe and Brδ of 80 Gμm, 100 Gμm, and 125 Gμm.

Recorded magnetization patterns a having recording densities of 10 kFRPI and 80 kFRPI are formed on this medium D, and these recorded magnetization patterns a are observed using magnetic force microscope 12. The MFM image thus obtained by this observation is quantitative averaged at an MFM reproduction width of 0.1 μm by means of MFM output signal extractor 14 to obtain MFM output signal b. The average amplitude of MFM output signal b is then calculated as output reproduction c and the standard deviation of the amplitude is calculated as medium noise d by means of waveform value analyzer 16, whereby the S/N ratio of medium D is measured. Similar measurement is further carried out while offtracking for every 0.1 μm to measure the offtrack characteristic of the S/N ratio of medium D.

Figure 10:
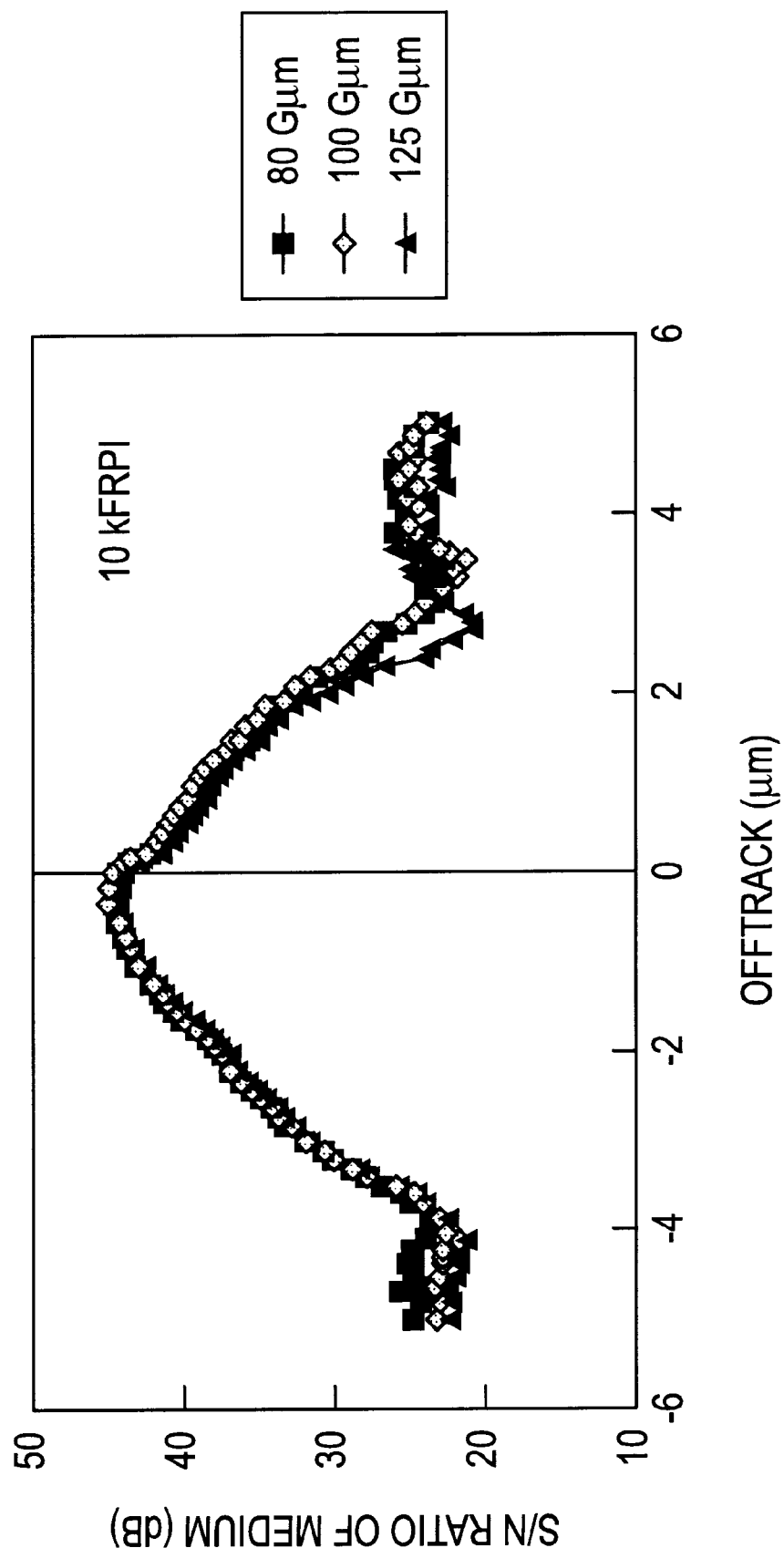
FIG. 10 is a graph showing the offtrack characteristic of the S/N ratio at a recording density of 10 kFRPI of three types of medium having differing Br$\delta$ as measured by the recorded magnetization state measurement device of the present invention.
Figure 11:
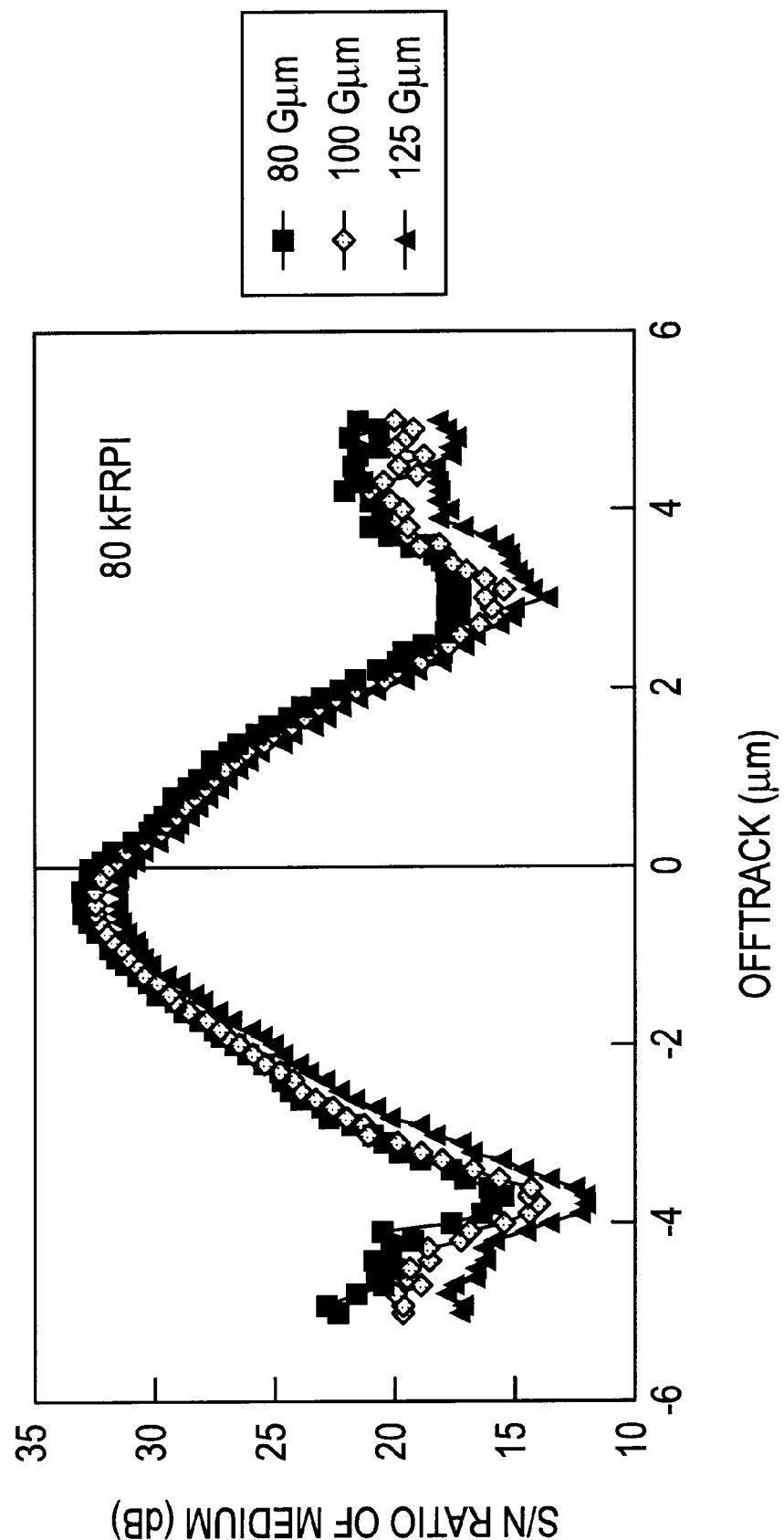
FIG. 11 is a graph showing the offtrack characteristic of the S/N ratio at a recording density of 80 kFRPI of three types of medium having differing Br$\delta$ as measured by the recorded magnetization state measurement device of the present invention.

FIGS. 10 and 11 show the results of measurement. In a method of the prior art that uses reproducing head 21, the phenomenon actually measured is an average value of the total track width, and an accurate measurement of a local state within a track is therefore not possible. The present embodiment, however, enables accurate measurement of the recorded magnetization state of areas that are smaller than the reproducing head (for example, area of 0.1 μm) and that cannot be measured by reproducing head 21. The present invention is particularly effective for measuring the state of track edges.

(4) Fourth Embodiment

Explanation is next presented regarding the fourth embodiment. Explanation is here limited to points differing from the above-described first embodiment.

In the present embodiment, three types of medium D are used having a magnetic coercive force of 2400 Oe and in which Brδ is 80 Gμm, 100 Gμm, and 125 Gμm.

A recorded magnetization pattern a having a recording density of 10 kFRPI is formed on this medium D, and this recorded magnetization pattern a is observed by magnetic force microscope 12. The MFM image obtained by this observation is quantitative averaged at an MFM reproduction width of 2 μm by means of MFM output signal extractor 14 to obtain MFM output signal b. The average value and the standard deviation of the amplitude of this MFM output signal b are then calculated by means of waveform value analyzer 16 as output reproduction c and medium noise d, respectively, thereby allowing measurement of the S/N ratio of medium D. Similar measurement is carried out while offtracking for every 0.1 μm to measure the offtrack characteristic of medium noise d.

Figure 12:
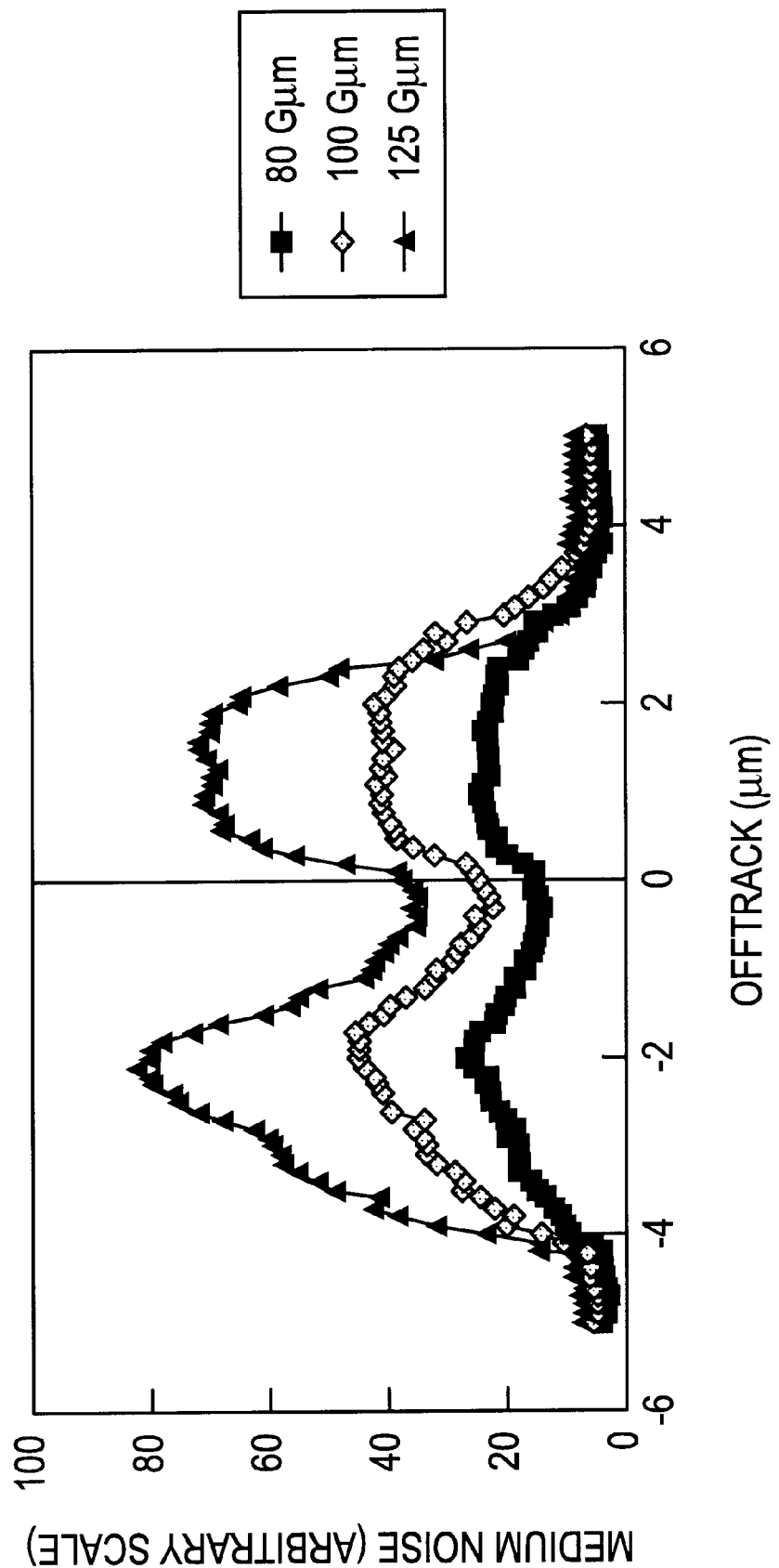
FIG. 12 is a graph showing the offtrack characteristic of medium noise at a recording density of 10 kFRPI of three types of medium of differing Br $\delta$ as measured by the recorded magnetization state measurement device of the present invention.

These measurement results are shown in FIG. 12. From these results, it can be seen that medium noise d at track edges increases with increase in Brδ. In a measurement method of the prior art that uses reproducing head 21, accurate measurement was not possible in narrow track widths of 0.1 μm because the reproduced signal was too small. In the present embodiment, however, the MFM reproduction width can be freely selected, and moreover, an adequate reproduced signal can be obtained, thereby enabling accurate measurements even at narrow track widths. This invention is particularly effective for measuring the state of the track edges.

(5) Fifth Embodiment

Explanation is next presented regarding the fifth embodiment. Explanation is here limited to points differing from the above-described first embodiment.

As the magnetic characteristics of medium D used in the present embodiment, magnetic coercive force is 2200 Oe and Brδ is 125 Gμm. A recorded magnetization pattern a is formed using a recording head for which the recording track width is 4 μm and the gap length is 0.5 μm.

The recorded magnetization patterns a formed in this embodiment have recording densities of 10, 20, 40, 80, 120 and 160 kFRPI. These recorded magnetization patterns a are observed by means of magnetic force microscope 12 while varying the spacing L between medium D and detection chip 12a in a range from 10 to 600 nm. The obtained MFM images are quantitative averaged to obtain MFM output signal b.

Figure 13:
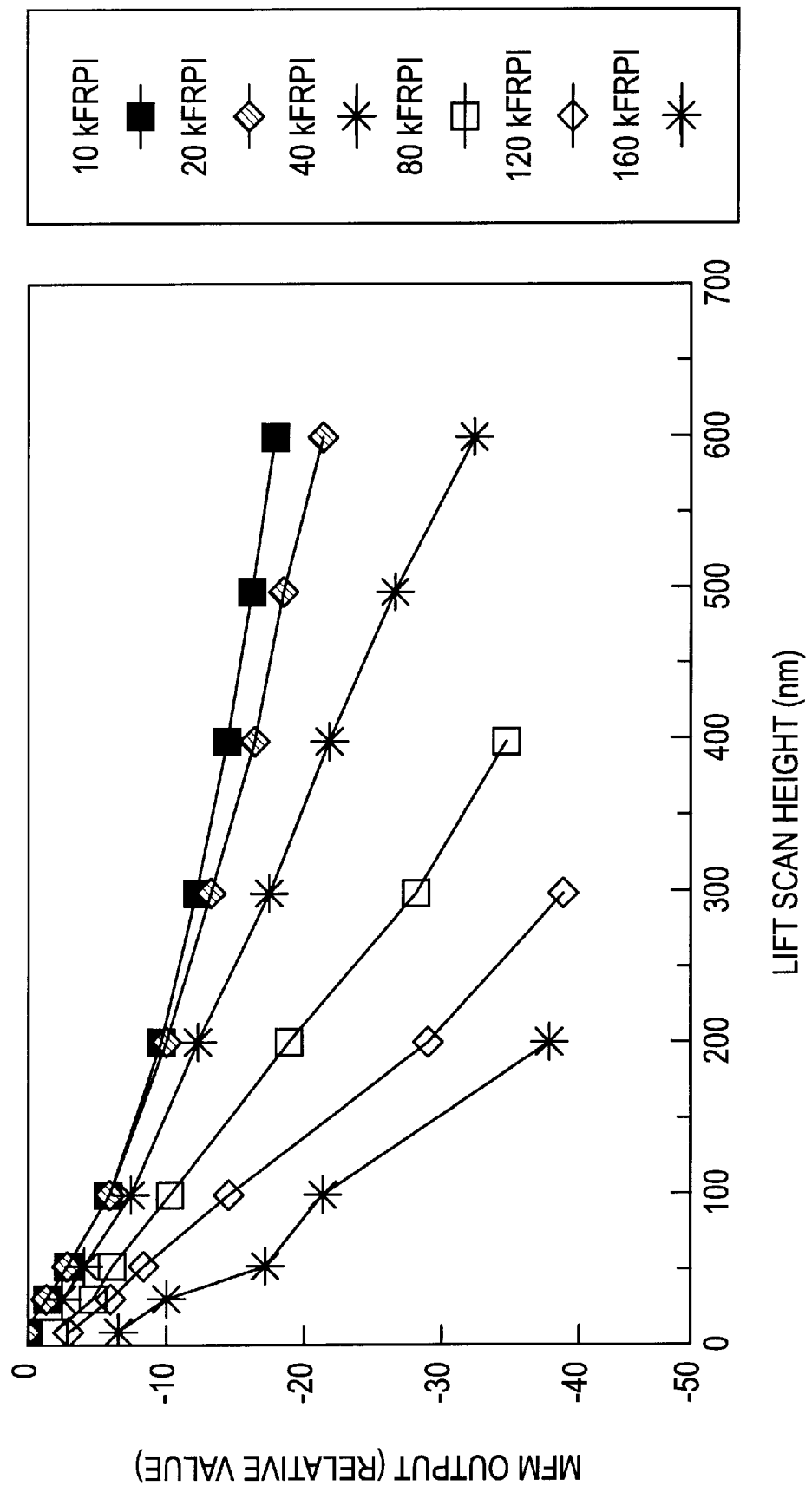
FIG. 13 is a graph showing the dependence upon lift scan height of the MFM output represented with magnitude of MFM output in a case in which the recording density of the recorded magnetization pattern is 10 kFRPI and the space L between the recording medium and detection chip is 10 nm as a standard.

FIG. 13 is a graph showing the MFM output (relative value) at each recording density and spacing. As a standard value, this graph takes MFM output signal b at which the recording density of recorded magnetization pattern a is 10 kFRPI and the spacing (lift scan height) L between medium D and detection chip 12a is 10 nm. FIG. 13 indicates the dependence of MFM output signal b upon lift scan height in this embodiment. Therefore, the dependence of output reproduction by reproducing head upon lift scan height 21 can be inferred. Magnetic force microscope 12 can be considered a narrow-gap magnetic head that takes detection chip 12a as a magnetic sensor, and the spacing L between detection chip 12a and medium D can be freely controlled. Furthermore, the dependence of the S/N ratio of medium D upon lift scan height can be measured by finding the S/N ratio of medium D as in the first embodiment. In this embodiment. the dependence of MFM output upon lift scan height is found in the waveform value analyzation process (Step 104) in the flow chart of FIG. 3.

(6) Sixth Embodiment

Explanation is next presented regarding the sixth embodiment of the present invention. Explanation is here limited to points differing from the above-described first embodiment.

As the magnetic characteristics of the medium D used in this embodiment, the magnetic coercive force is 2200 Oe and Brδ is 80 Gμm. Recorded magnetization patterns a are formed using recording heads 20 having recording track widths of 4 μm, 1 μm, and 0.5 μm.

In this embodiment, the averages of MFM outputs of recording heads 20 having recording track widths of 4 μm, 1 μm, and 0.5 μm are 4.25, 3.5, and 2.0 (relative values), respectively. Here, it is found that when the recorded magnetization pattern of a 4 μm-recording track width is reproduced by reproducing head 21 of 4 μm-reproduction width, the output is 600 μVpp.

Based on the average value Mf1 and the output reproduction Or 1 by reproducing head 21 of a particular recording track width Ww1 and the average value Mf2 of a different recording track width Ww2, the output reproduction Or2 by reproducing head 21 of recording track width Ww2 can be calculated using the formula:

Or2=Or1×Mf2×Ww2/(Mf1×Ww1)

Thus, the output Or by means of reproducing head 21 of recorded magnetization pattern a recorded by recording head 20 of a 1 μm-recording track width can be calculated:

Or=600×3.5×1/(4.25×4)=123.5 μVpp and the output Or' by means of reproducing of head 21 of recorded magnetization pattern a recorded by recording head 20 of a 0.5 μm-recording track width can be calculated:

Or'=600×2.0×0.5/(4.25×4)=35.3 μVpp

First, medium D is recorded by both of a recording head 20 of wide track width and a recording head 20 of narrow track width, and then the relation of each of the MFM outputs of two recording heads 20 while recording and the output reproduction by reproducing head 21 as for recorded magnetization pattern a recorded by recording head 20 of wide track width are found. Therefore, the output reproduction by reproducing head 21 as for recorded magnetization pattern a recorded by recording head 20 of narrow track width can be calculated on the basis of them. Calculation is thus possible for the hypothetical output reproduction by reproducing head 21 with regard to a recorded magnetization pattern a of narrow track width for which reproduction is not possible by an ordinary reproducing head 21. The recorded magnetization state may therefore be measured without actually using reproducing head 21 for a recorded magnetization pattern a of track widths of 1 $\mu$m or 0.5 $\mu$m that could not be reproduced by reproducing head 21 of the prior art.

As in the first embodiment, the S/N ratio of medium D may also be measured for a head of narrow track width. In the present embodiment, output reproduction is found in the waveform value analyzation process (Step 104) in the flow chart of FIG. 3.

(7) Seventh Embodiment

Explanation is next presented regarding the seventh embodiment of the present invention. Explanation is limited to those points that differ from the above-described first embodiment.

Figure 14:
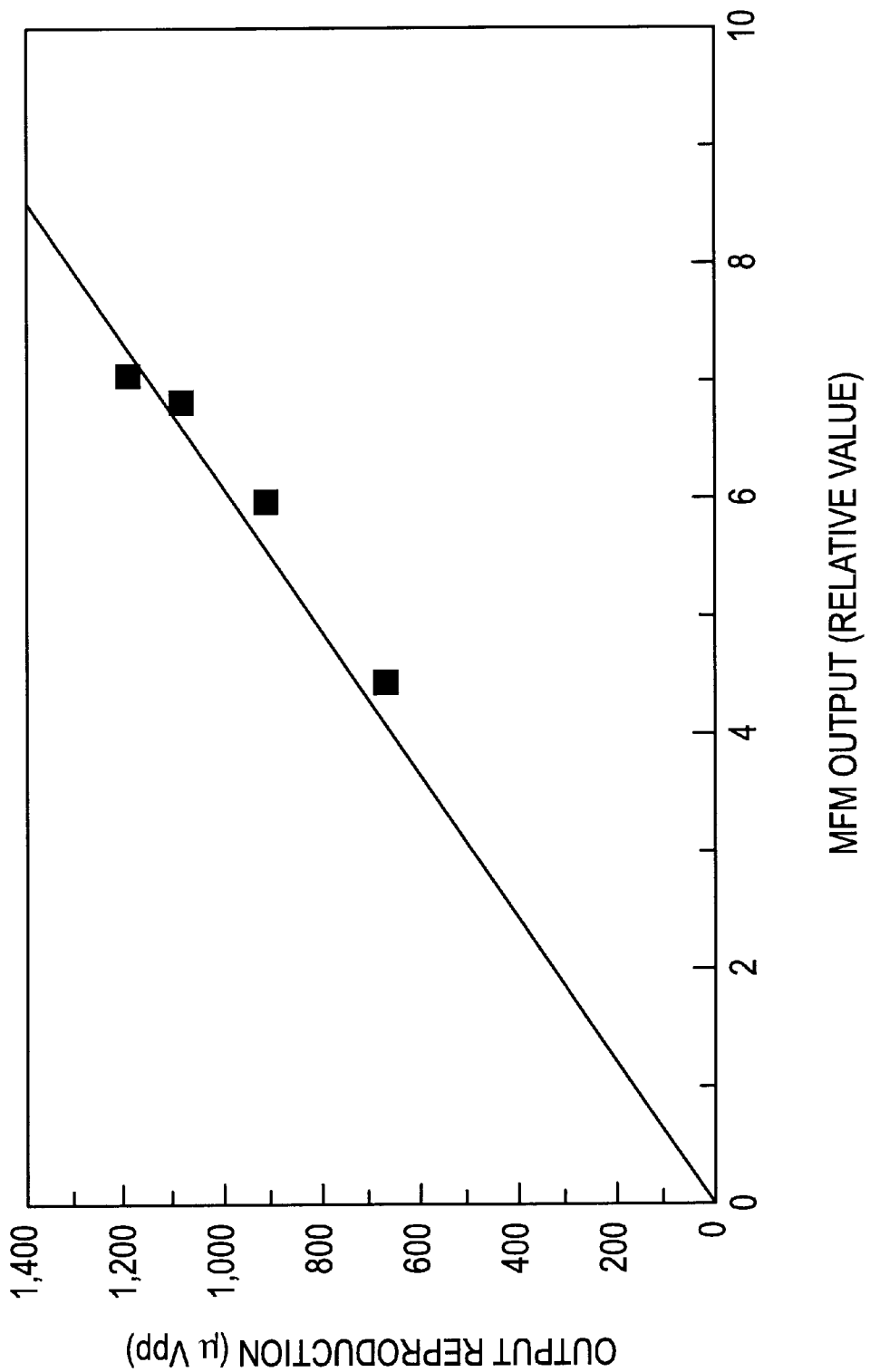
FIG. 14 is a graph showing the relation between MFM output obtained by means of a magnetic force microscope and output reproduction obtained by means of a reproducing head.

The present embodiment employs a medium D having magnetic characteristics such that Br$\delta$ is 80–125 G$\mu$m and magnetic coercive force is 2200 Oe. A recorded magnetization pattern a is formed using recording head 20 having a recording track width of 4 $\mu$m and a gap length of 0.5 $\mu$m. The recording density of the recorded magnetization pattern a formed in this embodiment is 10 kFRPI. The MFM output (relative value) obtained as in the first embodiment and the output reproduction when reproduced by using reproducing head 21 (0.3 $\mu$m reproduction gap length) are then found for several mediums D having differing Br$\delta$. The results are shown in FIG. 14. According to these results, The MFM output obtained by magnetic force microscope 12 is substantially proportional to the output obtained from reproducing head 21. By making use of this relation, the output reproduction can be found based on MFM output even for a medium D for which Br$\delta$ is unknown and a recorded reproduction evaluation by a reproducing head has not been carried out. For example, if the MFM output is 8 (relative value) when the same type of recorded magnetization pattern a as described hereinabove is recorded on the medium D of this embodiment, the output of this medium D obtained by reproducing head 21 can be seen from the graph of FIG. 14 to be 1100 $\mu$Vpp. In other words, by using recorded magnetization state measurement device 10 of this invention, the size of output obtained by means of reproducing head 21 can be found without actually carrying out evaluation by reproducing head 21. In the present embodiment, MFM output is found in the waveform value analyzation process (Step 104) of the flow chart of FIG. 3.

(8) Eighth Embodiment

Explanation is next presented regarding the eighth embodiment. Explanation is limited to only those points that differ from the above-described first embodiment.

Figure 15:
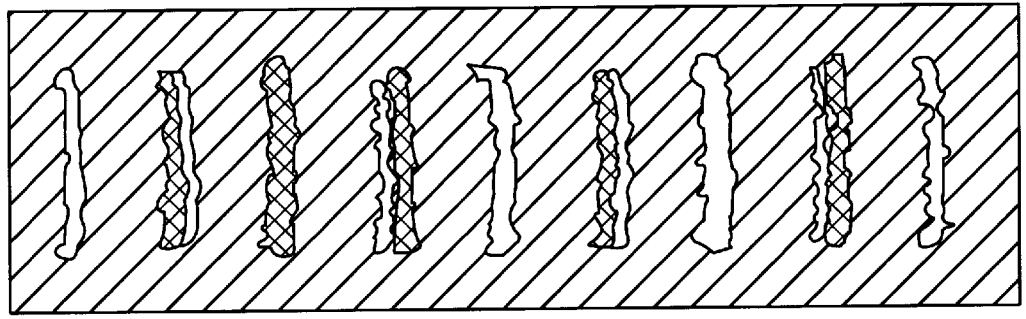
FIG. 15 is a plan view showing a recorded magnetization pattern (a dibit pattern corresponding to a recording density of 150 kFRPI) detected by means of a magnetic force microscope of the recorded magnetization state measurement device of the present invention.
Figure 16:
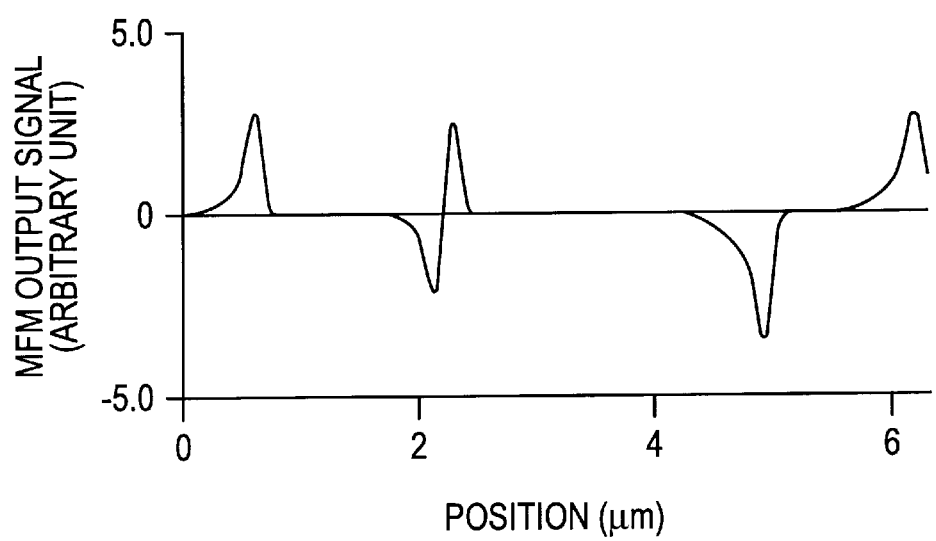
FIG. 16 is a waveform chart showing an MFM output signal extracted from the recorded magnetization pattern of FIG. 13.

This embodiment employs a medium D having a magnetic characteristic in which the magnetic coercive force is 2400 Oe and Br$\delta$ is 100 G$\mu$m. A recorded magnetization pattern a is formed using recording head 20 of 5 $\mu$m-track width. In this embodiment, a dibit pattern is recorded that corresponds to a 150 kFRPI recording density as shown in FIG. 15 and FIG. 16. This recorded magnetization state is then observed by means of magnetic force microscope 12, and the MFM output is averaged in the direction of track width. In addition, recording density is more accurate due to recording compensation at the time of recording. At this time, peak spacing of the dibit pattern is measured at 150 nm. The original bit-length at this recording density is 169 nm, but in this embodiment, the bit-length is 19 nm shorter than the original bit-length. This shift has its source in non-linear transition shift, from which it can be seen that the amount of non-linear transition shift is 19 nm, or approximately 11%.

Figure 17:
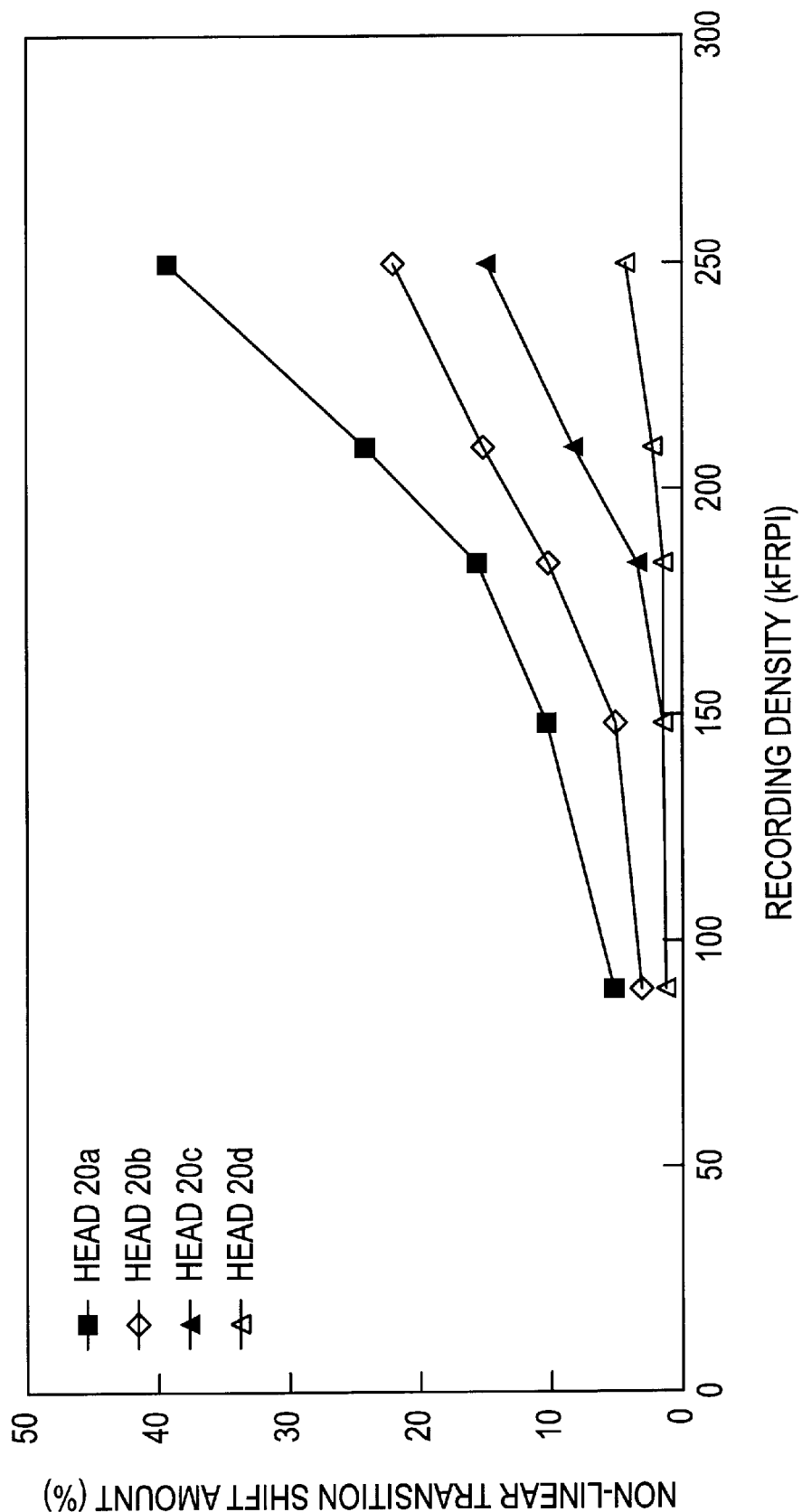
FIG. 17 is a graph showing the dependence upon recording density of the amount of non-linear transition shift found from an MFM output signal in the recorded magnetization state measurement method of the present invention.

In this embodiment, dibit pattern recording and peak-spacing measurement are carried out for various recording densities to find the amount of non-linear transition. This sequence of processes was carried out for four recording heads 20a–20d, and the results are shown in FIG. 17. From this graph can be seen the dependence upon recording density of the amount of non-linear transition shift of each of recording heads 20a–20d. Furthermore, the vertical axis is the ratio of the amount of non-linear transition shift to the bit length of each recording density. The present invention thus enables measurement of the amount of non-linear transition shift. In this embodiment, non-linear transition shift is found in the waveform value analyzing process (Step 104) in the flow chart of FIG. 3.

(9) Ninth Embodiment

Explanation is next presented regarding the ninth embodiment of the present invention. Explanation is here limited to only those points that differ from the above-described first embodiment.

As in the eighth embodiment. a dibit pattern corresponding to the 150 kFRPI recording density shown in FIGS. 15 and 16 is recorded. And within recorded areas, the output of satisfactory portions (the maximum value or most numerous output values of MFM output) is found as reference output M1. Next, the MFM reproduction width is made to match the recorded track width, and an averaged MFM output M2 in the direction of this width is found. The ratio of partial erasure PE1 to the total recorded track is then found as:

PE1=(M1−M2)/M1×100

Figure 18:
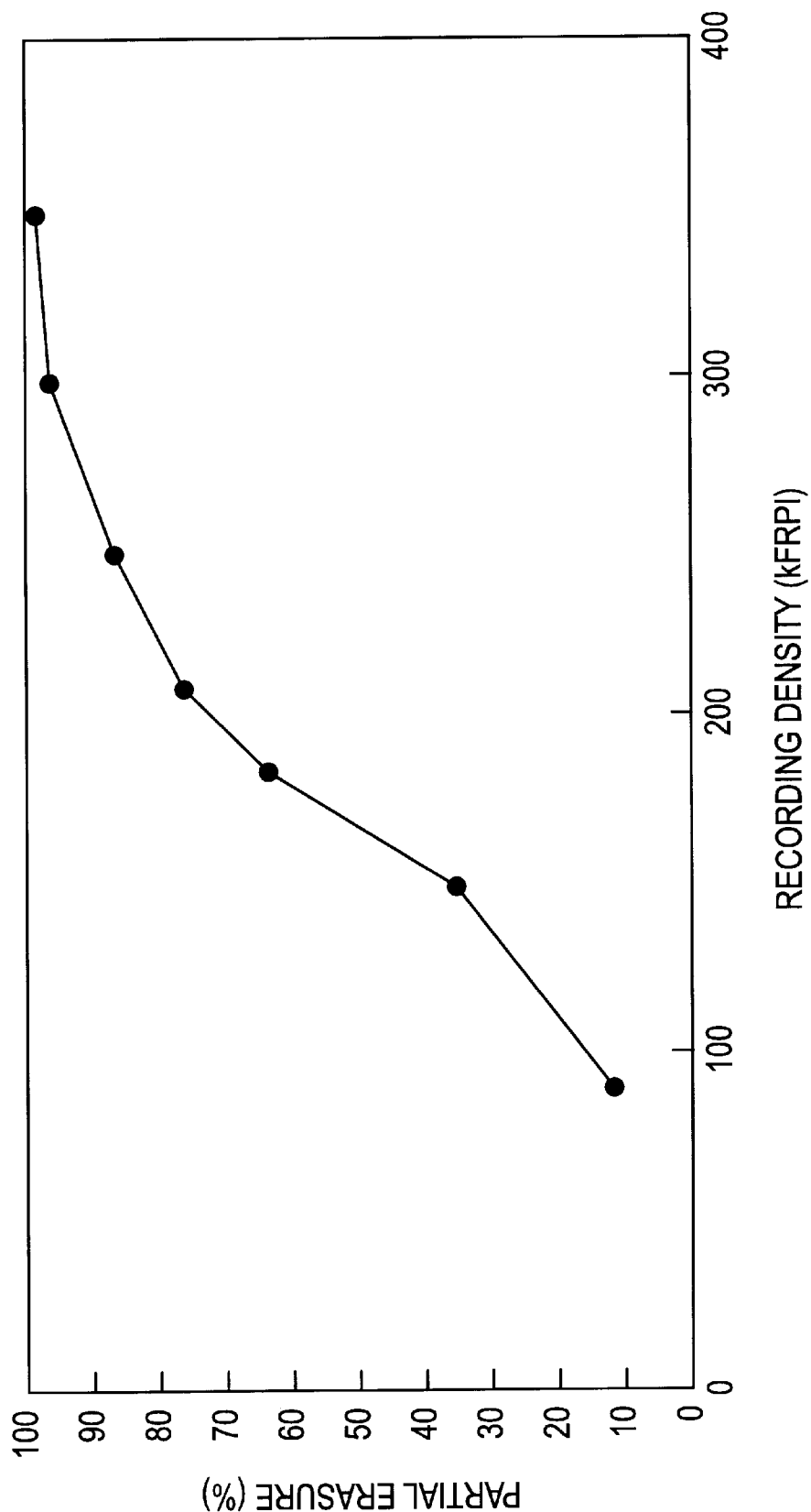
FIG. 18 is a graph showing the dependence upon recording density of the ratio of occurrence of partial erasure to the total recorded track width, as found by means of the recorded magnetization state measurement method of the present invention.

FIG. 18 shows the dependence upon recording density of the ratio of occurrence of partial erasure to the total recorded track width. The recorded magnetization state can thus be accurately measured independently of any influence from reproducing head 21. The recorded magnetization state measurement device 10 of the present invention enables elimination of the non-linear transition shift and the direct measurement of the recorded magnetization pattern, thus enabling the separation of partial erasure and non-linear transition shift. In this embodiment, partial erasure is found in the waveform value analyzation process (Step 104) in the flow chart of FIG. 3.

(10) Tenth Embodiment

Explanation is next presented of the tenth embodiment of the present invention. Explanation is here limited to only those points that differ from the above-described first embodiment.

Similar to the ninth embodiment, a dibit pattern corresponding to a 150 kFRPI recording density is recorded and reference output MI is found, the MFM reproduction width is made to match the track width of the reproducing head, and averaged MFM output M3 is found, whereby the ratio of partial erasure PE2 to the total reproduction track can be calculated as:

PE2=(M1−M3)/M×100

Figure 19:
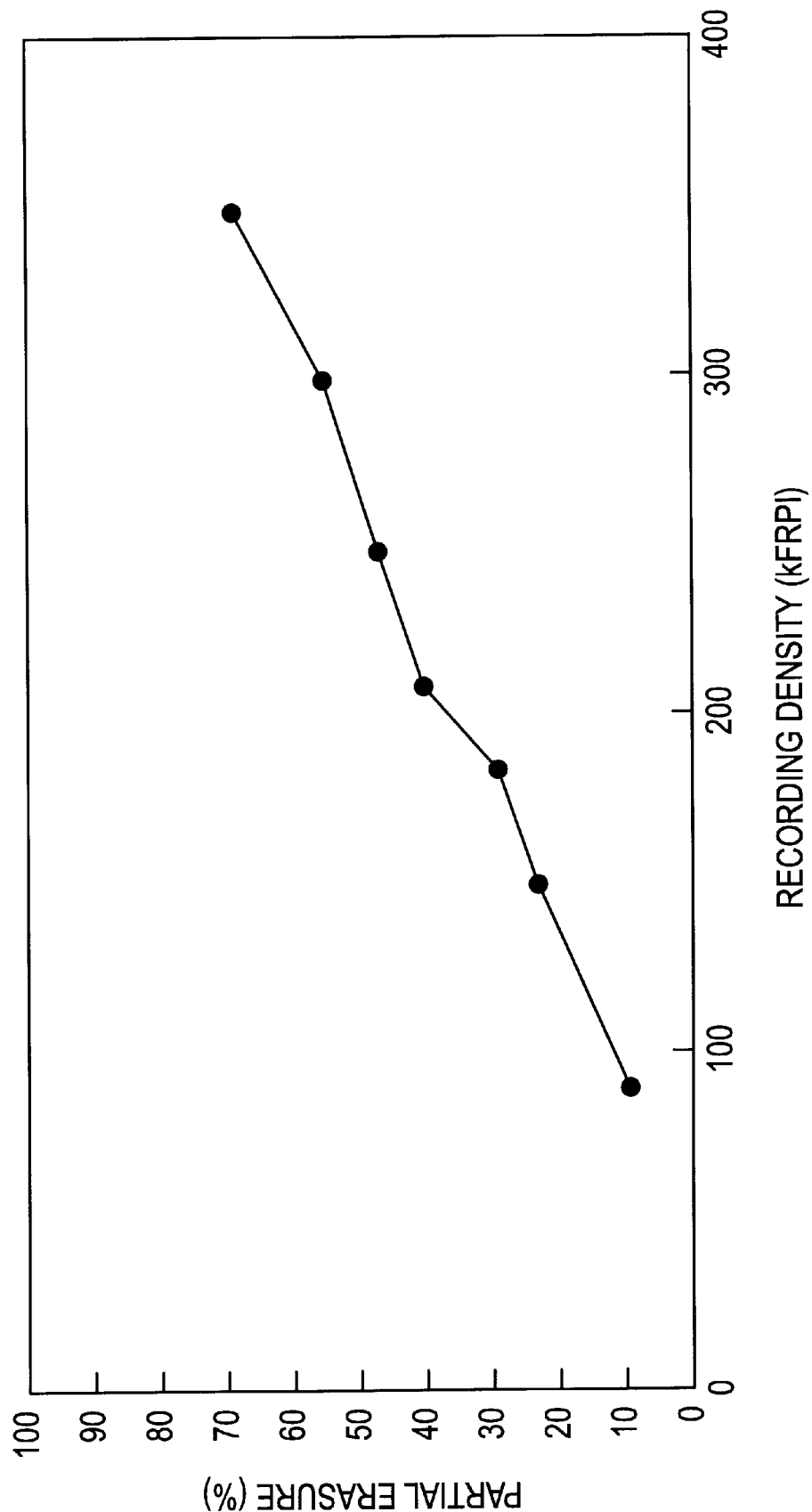
FIG. 19 is a graph showing the dependence upon recording density of the ratio of occurrence of partial erasure to the total recorded track width as found by means of the recorded magnetization state measurement of the present invention.

FIG. 19 shows the dependence upon recording density of the ratio of occurrence of partial erasure to the total recorded track width. The recorded magnetization state can thus be accurately measured without influence from reproducing head 21, and can further be compared with the magnetization information obtained by using reproducing head 21. In the present embodiment, partial erasure is found in the waveform value analyzation (Step 104) of the flow chart in FIG. 3.

(11) Eleventh Embodiment

Explanation is next presented regarding the eleventh embodiment of the present invention. Explanation is here limited to only those points that differ from the first embodiment described hereinabove.

Similar to the ninth embodiment, a dibit pattern is recorded that corresponds to a 150 kFRPI recording density, and reference output M1 is found. Averaged MFM output M4 is then found with the MFM reproduction width of 0.029 μm. Here, the local partial erasure PE3 of the track can be calculated as:

$$PE3=(M1-M4)/M1\times 100$$

and the local partial erasure PE3 can be quantified.

Figure 20:
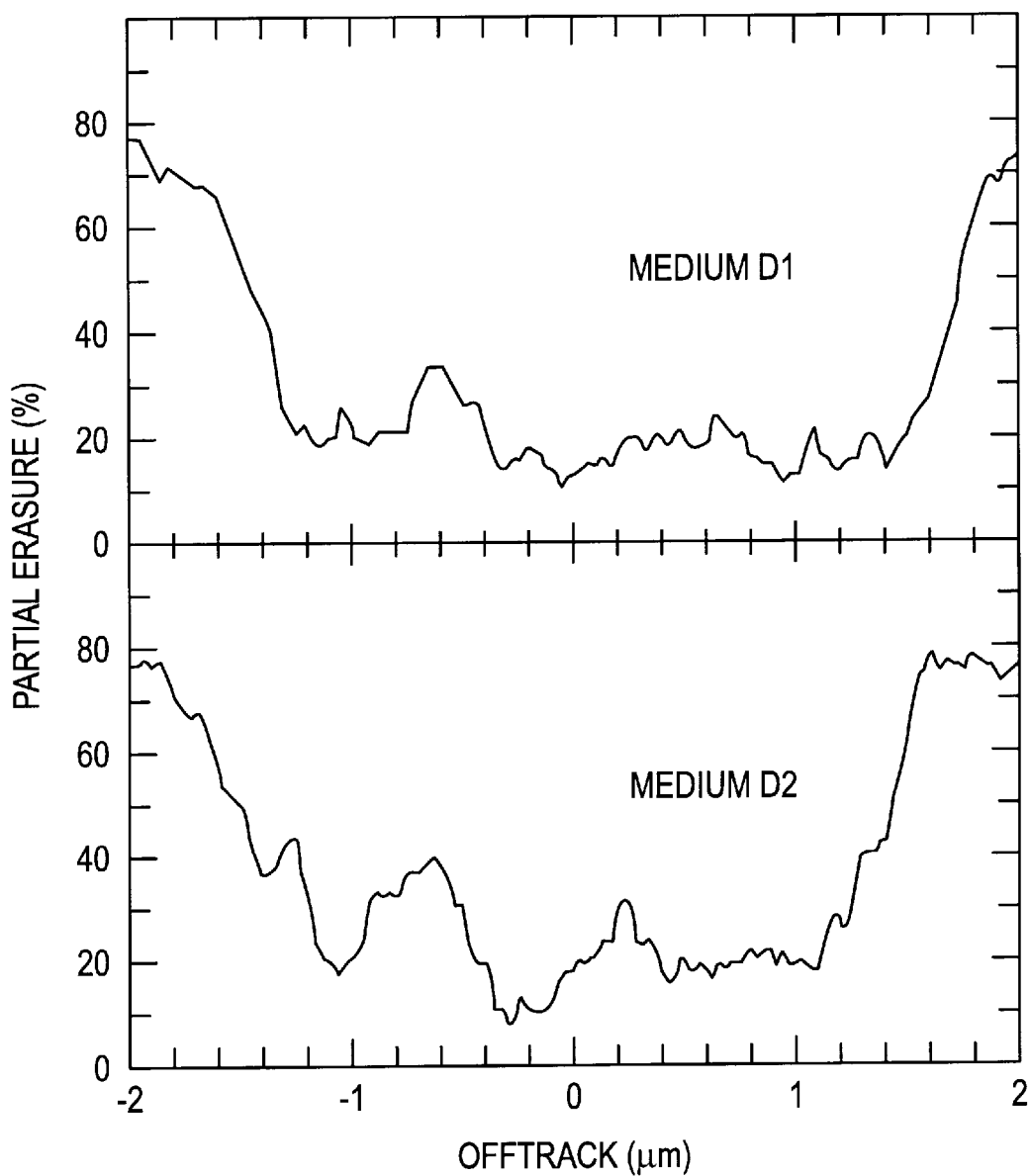
FIG. 20 is a graph showing the distribution of occurrence of partial erasure in the offtrack direction at a recording density of 130 kFRPI as found by the recorded magnetization state measurement method of the present invention.

In this embodiment, MFM average output is successively measured as the MFM reproduction width is shifted in the direction of track width. FIG. 20 shows the distribution of occurrence of partial erasure PE3 at a 130 kFRPI recording density for two types of medium measured by this process. The horizontal axis shows the degree of offtrack from the ontrack position, and the vertical axis shows the magnitude of partial erasure. As magnetic characteristics, medium D1 has a magnetic coercive force of 2200 Oe, Brδ of 150 G$\mu$m, and a magnetic coercive force orientation ratio (magnetic coercive force in the direction of circumference divided by the magnetic coercive force in the direction of radius) of 1.0; and medium D2 has a magnetic coercive force of 2200 Oe, Br of 150 G$\mu$m, and a magnetic coercive force orientation ratio of 1.4.

From FIG. 20 it can be seen that the degree of partial erasure at the track edges is great. In this way, the present invention enables accurate measurement of local information for an area smaller than the width of reproducing head 21. In addition, partial erasure is found in the waveform value analyzation process (Step 104) of the flow chart in FIG. 3.

(12) Twelfth Embodiment

Explanation is next presented regarding the twelfth embodiment of the present invention. Explanation is here limited to those points that differ from the first embodiment described hereinabove.

Figure 21:
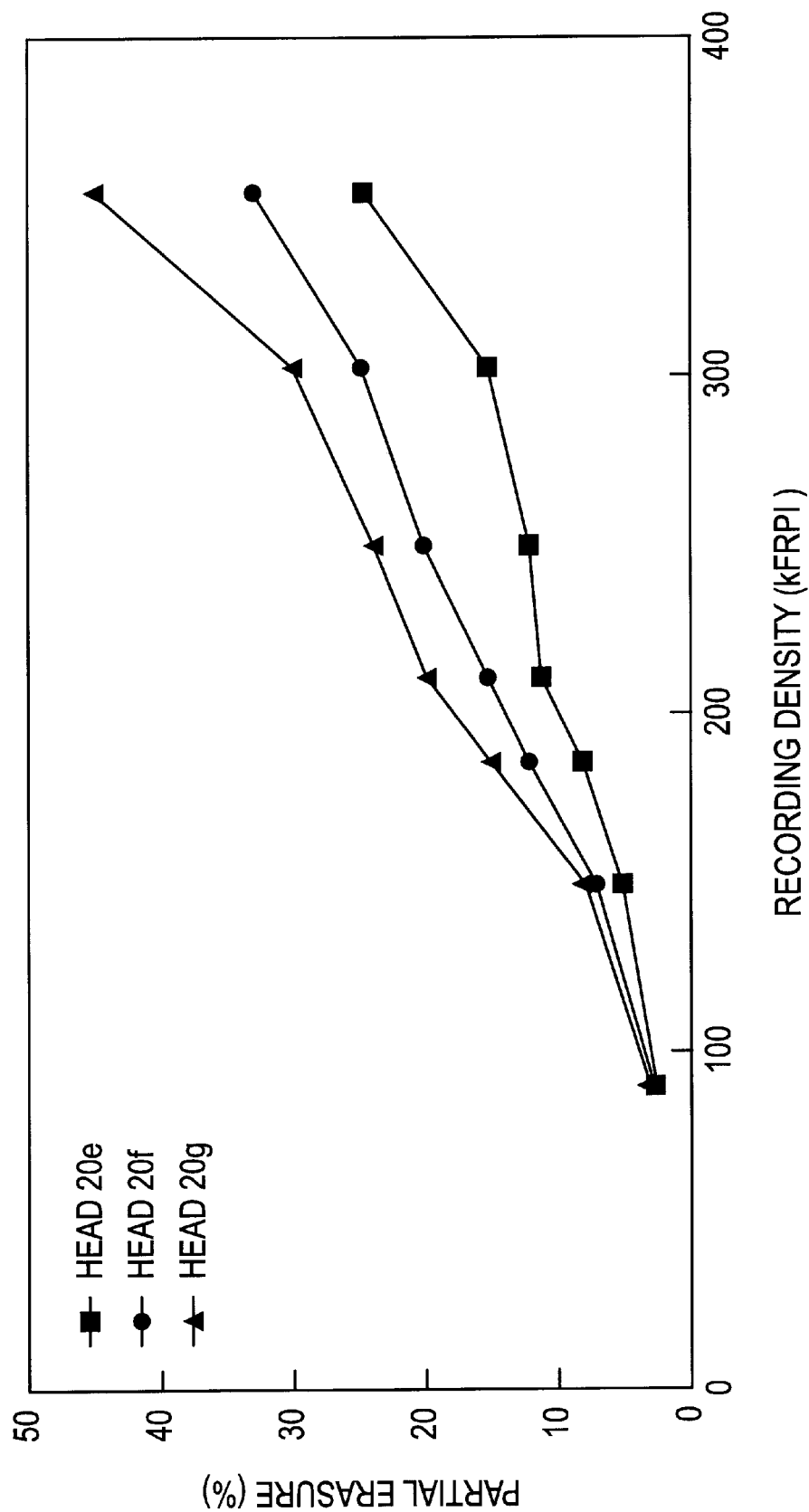
FIG. 21 is a graph showing the dependence upon recording density of partial erasure as found by the recorded magnetization state measurement method of the present invention.

In a process similar to the tenth embodiment, three recording heads 20 (head 20e, head 20f, and head 20g) having 4 μm track width and differing light gap-lengths are used to carry out recording at a recording density ranging from 80 to 350 kFRPI, following which partial erasure is measured. The results of this measurement are shown in FIG. 21. Here, the MFM reproduction width is 3 μm. The recording capability of recording head 20 can be evaluated based on this partial erasure free of influence from reproducing head 21. Partial erasure is found in the waveform value analyzation process (Step 104) in the flow chart of FIG. 3.

(13) Thirteenth Embodiment

Explanation is next presented regarding the thirteenth embodiment of the present invention. Explanation is here limited to those points that differ from the first embodiment described hereinabove.

Figure 22:
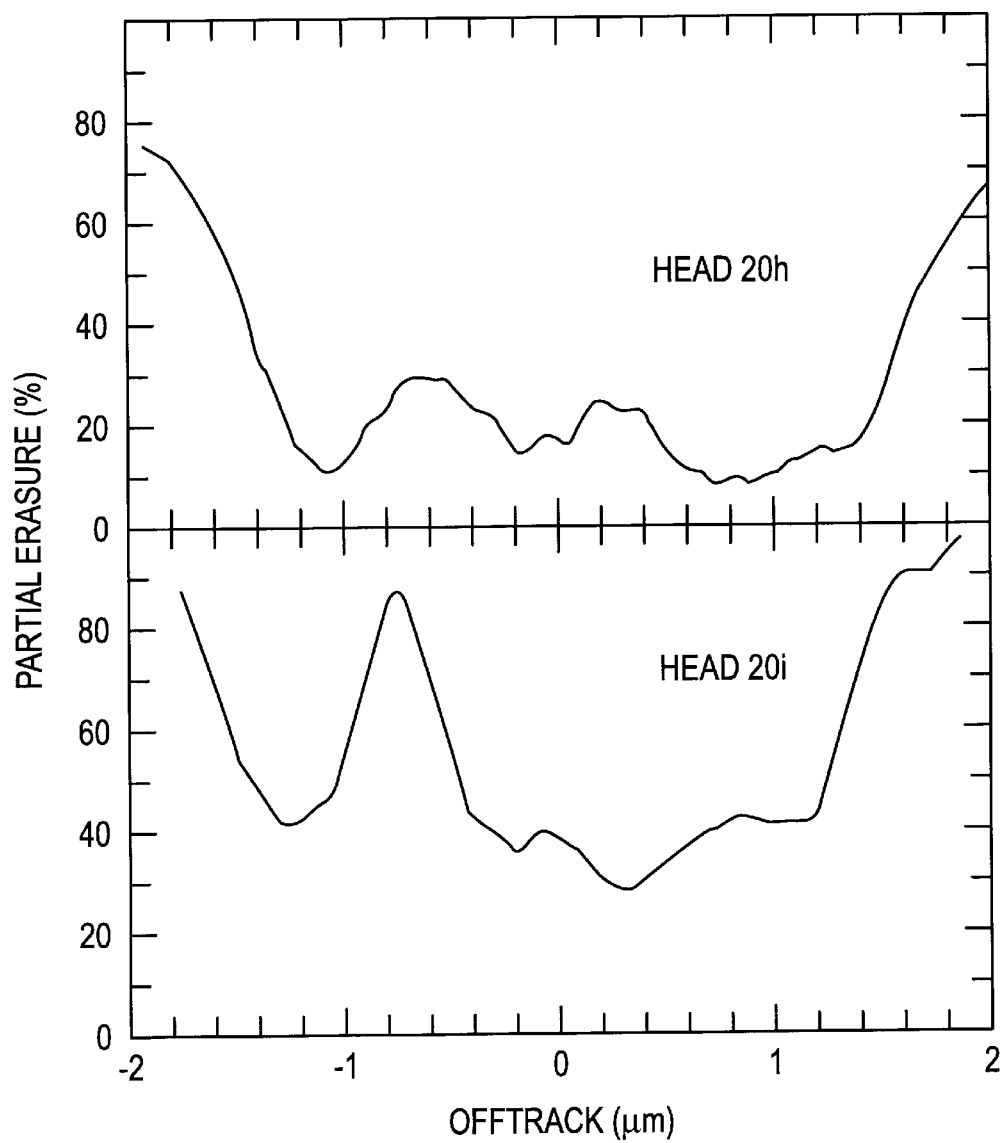
FIG. 22 is a graph showing the distribution of the occurrence of partial erasure in the offtrack direction at a recording density of 200 kFRPI as found by the recorded magnetization state measurement method of the present invention.

In a process similar to the eleventh embodiment, the difference in partial erasure by two recording heads of differing material was investigated. In this embodiment, MFM average output is measured at a recording density of 200 kFRPI while shifting MFM reproduction width (0.12 μm) in the direction of track width to find local partial erasure of a track. FIG. 22. shows the distribution of the occurrence of partial erasure at a recording density of 200 kFRPI of these two types of heads. The horizontal axis shows the offtracking distance from the ontrack position, and the vertical axis shows the magnitude of partial erasure. Here, head 20h has a NiFe core, and head 20i has a FeTaN core. It can be seen that there was little partial erasure within all tracks recorded with FeTaN head 20i. Local information for an area smaller than the width of reproducing head 21 can thus be accurately measured by using the recorded magnetization state measurement device 10 of the present invention. In this embodiment, partial erasure is found in the waveform value analyzation process (Step 104) of the flow chart of FIG. 3.

While preferred embodiments of the present invention have been described using specific terms, such description is for illustrative purposes only, and it is to be understood that changes and variations may be made without departing from the spirit or scope of the following claims.

What is claimed is:

1. A recorded magnetization state measurement method, comprising the steps of:

(a) providing a magnetic force microscope;

(b) detecting, with said magnetic force microscope, a recorded magnetization pattern formed on a magnetic recording medium;

(c) extracting, from said recorded magnetization pattern of step (b), an output signal in one-dimension along the direction of recording for a prescribed reproduction width; from a recorded magnetization pattern detected by said magnetic force microscope; and (d) calculating, with a waveform value analyzer, an average amplitude value of the output signal, thereby determining an output reproduction signal.

2. The recorded magnetization state measurement method according to claim 1 wherein the prescribed reproduction width of step (c) is from 1 nm to 500 nm.

3. The recorded magnetization state measurement method according to claim 1 wherein:

said recorded magnetization pattern detection of step (a) is carried out for at least one predetermined distance between a detection chip of said magnetic force microscope and said magnetic recording medium;

said output signal extraction of step (c) is carried out for each said predetermined distance; and said output reproduction signal calculation of step (d) is carried out for each said predetermined distance.

4. The recorded magnetization state measurement method according to claim 1, further comprising the steps of:

(e) providing a reproducing head;

(f) extracting, with said reproducing head, an output reproduction signal Or1 for a predetermined track width Ww1;

(g) performing the average amplitude value calculation of step (d) for predetermined recorded track widths Ww1 and Ww2 of different sizes, to provide output reproduction signals Mf1 and Mf2, respectively; and based on the average amplitude value Mf1 and the output reproduction signal Or1, and the average amplitude value Mf2, calculating output reproduction signal Or2 of said reproducing head for said recorded track width Ww2, using the formula:

$$Or2=Or1 \times Mf2 \times Ww2/(Mf1 \times Ww1).$$

5. A recorded magnetization state measurement method according to claim 4, wherein said recorded magnetization pattern is a two-bit pattern.

6. The recorded magnetization state measurement method according to claim 1, further comprising the steps of:

(e) performing the average amplitude value calculation of step (d) for a predetermined portion of said reproduction width, to provide an average amplitude value M1, and for said reproduction width matched to a recorded track width, to provide average amplitude value M2; and (f) calculating a ratio occurrence of partial erasure PE1 (%) of a total recorded track using the formula:

$$PE1=(M1-M2)/M1 \times 100.$$

7. A recorded magnetization state measurement method according to claim 6 wherein:

said MFM output signal extraction step is carried out for each type of recording head that formed said recorded magnetization pattern; and said output reproduction calculation step is carried out for each type of said recording head.

8. A recorded magnetization state measurement method according to claim 6 wherein said recorded magnetization pattern is a dibit pattern.

9. The recorded magnetization state measurement method according to claim 1, further comprising the steps of:

(e) providing a reproducing head;

(f) performing the average amplitude value calculation of step (d) for a predetermined portion of said reproduction width, to provide an average amplitude value M1, and for said reproduction width matched to the track width of said reproducing head, to provide an average amplitude value M3; and (g) calculating a ratio occurrence of partial erasure PE2 (%) of a total recorded track using the formula:

$$PE2=(M1-M3)/M1 \times 100.$$

10. A recorded magnetization state measurement method according to claim 9 wherein said recorded magnetization pattern is a two-bit pattern.

11. A recorded magnetization state measurement method according to claim 9 wherein:

said MFM output signal extraction step is carried out for each type of recording head that formed said recorded magnetization pattern; and said output reproduction calculation step is carried out for each type of said recording head.

12. The recorded magnetization state measurement method according to claim 1, further comprising the steps of:

(e) providing a reproducing head; and (f) performing the average amplitude value calculation of step (d) for a predetermined portion of said reproduction width, to provide an average amplitude value M1, and for said reproduction width within a range from 1 nm to 500 nm, to provide an average amplitude value M4; and (g) calculating a proportion occupied by partial erasure PE3 (%) using the formula:

$$PE3=(M1-M4)/M1 \times 100.$$

13. A recorded magnetization state measurement method according to claim 12 wherein:

said MFM output signal extraction step is carried out for each type of recording head that formed said recorded magnetization pattern; and said output reproduction calculation step is carried out for each type of said recording head.

14. The recorded magnetization state measurement method according to claim 1 wherein said recorded magnetization pattern is a dibit pattern.

15. The recorded magnetization state measurement method according to claim 1, further comprising the step of:

(e) calculating, with said waveform value analyzer, a standard deviation of the amplitude of the output signal, thereby determining a medium noise signal.

16. The recorded magnetization state measurement method according to claim 15 wherein:

said recorded magnetization pattern detection of step (a) is carried out for at least one predetermined distance between a detection chip of said magnetic force microscope and said magnetic recording medium;

said output signal extraction of step (c) is carried out for each said predetermined distance; and said medium noise calculation of step (e) is carried out for each said predetermined distance.

17. The recorded magnetization state measurement method according to claim 1, wherein said recorded magnetization pattern is produced using a recording head.

18. The recorded magnetization state measurement method according to claim 17 wherein said output signal extraction of step (c) is carried out for each type of recording head that formed said recorded magnetization pattern; and said output reproduction calculation of step (d) is carried out for each type of said recording head.

19. A recorded magnetization state measurement device, comprising:

a magnetic force microscope that detects a recorded magnetization pattern formed on a magnetic recording medium;

output signal extraction means for extracting from said recorded magnetization pattern an output signal in one-dimension along the direction of recording for a prescribed reproduction width; and waveform value analysis means for calculating an average amplitude value of the output signal extracted by said output signal extraction means to provide a reproduction output, and for calculating the standard deviation of amplitude of the output signal extraction means to provide medium noise.

20. A recorded magnetization state measurement device according to claim 19 wherein said prescribed reproduction width is from 1 nm to 500 nm.

21. A recorded magnetization state measurement device, comprising:

a magnetic force microscope that detects a recorded magnetization pattern formed on a magnetic recording medium and produces a corresponding detected signal;

an output signal extractor which receives the detected signal and extracts an output signal in one-dimension along the direction of recording for a prescribed reproduction width; and a waveform value analyzer which receives an input from said output signal extractor and calculates the average amplitude value of the output signal to provide an output reproduction signal and calculates the standard deviation of amplitude of the output signal to provide medium noise.

22. A recorded magnetization state measurement device according to claim 21 wherein said prescribed reproduction width is from 1 nm to 500 nm.

* * * * *

UNITED STATES PATENT AND TRADEMARK OFFICE
CERTIFICATE OF CORRECTION

PATENT NO.: 6,081,394
DATED: June 27, 2000
INVENTOR(S): Shinzo TSUBOI

It is certified that error(s) appears in the above-identified patent and that said Letters Patent is hereby corrected as shown below:

Column 10, line 62, delete "MI" insert --M1--

Signed and Sealed this

Eighth Day of May, 2001

*Attest:*

NICHOLAS P. GODICI

*Attesting Officer*      *Acting Director of the United States Patent and Trademark Office*